US012785360B2

(12) United States Patent
Halbritter et al.

(10) Patent No.: US 12,785,360 B2
(45) Date of Patent: Nov. 3, 2026

(54) SURFACE-EMITTING SEMICONDUCTOR LASER AND METHOD FOR PRODUCING A SURFACE-EMITTING SEMICONDUCTOR LASER

(71) Applicant: ams-OSRAM International GmbH, Regensburg (DE)

(72) Inventors: Hubert Halbritter, Dietfurt-Toeging (DE); Laura Kreiner, Regensburg (DE)

(73) Assignee: AMS-OSRAM INTERNATIONAL GMBH, Regensburg (DE)

( * ) Notice: Subject to any disclaimer, the term of this patent is extended or adjusted under 35 U.S.C. 154(b) by 605 days.

(21) Appl. No.: 18/262,797

(22) PCT Filed: Dec. 22, 2021

(86) PCT No.: PCT/EP2021/087302
§ 371 (c)(1),
(2) Date: Jul. 25, 2023

(87) PCT Pub. No.: WO2022/161714
PCT Pub. Date: Aug. 4, 2022

(65) Prior Publication Data
US 2024/0097401 A1 Mar. 21, 2024

(30) Foreign Application Priority Data
Feb. 1, 2021 (DE) ......................... 102021102277.0

(51) Int. Cl.
*H01S 5/11* (2021.01)
*H01S 5/185* (2021.01)
*H01S 5/42* (2006.01)

(52) U.S. Cl.
CPC ................ *H01S 5/11* (2021.01); *H01S 5/185* (2021.01); *H01S 5/42* (2013.01)

(58) Field of Classification Search
CPC ..................................... H01S 5/11; H01S 5/42
See application file for complete search history.

(56) References Cited

U.S. PATENT DOCUMENTS 7,012,279 B2 * 3/2006 Wierer, Jr. ........... G02B 6/1225 257/E33.068
2007/0201527 A1 8/2007 Hori et al.
(Continued)

FOREIGN PATENT DOCUMENTS

FR 3036004 A1 * 11/2016 ............. H01S 5/423
JP 2008060433 A * 3/2008
(Continued)

OTHER PUBLICATIONS

Wierer et al., Buried tunnel contact junction AlGaAs—GaAs—InGaAs quantum well heterostructure lasers with oxide-defined lateral currents, Appl. Phys. Lett. 71, 2286-2288. (Year: 1997).*
(Continued)

*Primary Examiner* — James A Menefee
(74) *Attorney, Agent, or Firm* — MH2 Technology Law Group LLP

(57) ABSTRACT

A surface-emitting semiconductor laser includes a first semiconductor layer of a first conductivity type, an active zone which is suitable for generating electromagnetic radiation, an ordered photonic structure, and a second semiconductor layer of a second conductivity type. The active zone is arranged between the first and second semiconductor layers. The ordered photonic structure is formed in the first semiconductor layer, and a part of the first semiconductor layer is adjacent to both sides of the ordered photonic structure. Alternatively, the ordered photonic structure is arranged in an additional semiconductor layer between the active zone and the second semiconductor layer. A part of the additional
(Continued)

semiconductor layer is arranged between the ordered photonic structure and the second semiconductor layer.

4 Claims, 16 Drawing Sheets

(56) References Cited

U.S. PATENT DOCUMENTS

| | | | | |
|---|---|---|---|---|
| 2010/0220763 | A1* | 9/2010 | Ikuta | B82Y 20/00 372/50.124 |
| 2011/0076791 | A1 | 3/2011 | Wu et al. | |
| 2011/0216796 | A1* | 9/2011 | Nagatomo | H01S 5/18 372/45.01 |
| 2012/0072931 | A1 | 3/2012 | Imada et al. | |
| 2013/0039375 | A1* | 2/2013 | Noda | H01S 5/04256 372/44.01 |
| 2013/0163630 | A1 | 6/2013 | Nagatomo et al. | |
| 2016/0248224 | A1* | 8/2016 | Noda | H01S 5/185 |
| 2017/0271849 | A1 | 9/2017 | Saito et al. | |
| 2019/0288483 | A1* | 9/2019 | Sugiyama | H01S 5/04256 |
| 2019/0312410 | A1* | 10/2019 | Sugiyama | H01S 5/18 |
| 2019/0319428 | A1 | 10/2019 | Kanzaki et al. | |
| 2020/0036163 | A1 | 1/2020 | Nishioka et al. | |
| 2021/0328406 | A1 | 10/2021 | Noda et al. | |
| 2022/0320827 | A1* | 10/2022 | Chen | H01S 5/11 |

FOREIGN PATENT DOCUMENTS

| | | | |
|---|---|---|---|
| JP | 2010093127 | A | 4/2010 |
| WO | 2010087231 | A1 | 8/2010 |
| WO | 2020050130 | A1 | 3/2020 |

OTHER PUBLICATIONS

Inoue et al., Design of photonic-crystal surface-emitting lasers with enhanced in-plane optical feedback for high-speed operation, Optics Express vol. 28 No. 4 (Feb. 2020) (Year: 2020).*

Herve, D. (Authorized officer), International Search Report and Written opinion dated May 31, 2022, PCT Application No. PCT/EP2021/087302, 24 pages (including English translation).

Sakata et al: "Dually modulated photonic crystals enabling high-power high-beam-quality two-dimensional beam scanning lasers"; Nature Communications | (2020)11:3487.

* cited by examiner

SURFACE-EMITTING SEMICONDUCTOR LASER AND METHOD FOR PRODUCING A SURFACE-EMITTING SEMICONDUCTOR LASER

CROSS-REFERENCE TO RELATED APPLICATIONS

The present application is a national stage entry from International Application No. PCT/EP2021/087302, filed on Dec. 22, 2021, published as International Publication No. WO 2022/161714 A1 on Aug. 4, 2022, and claims priority to German Patent Application No. 10 2021 102 277.0, filed Feb. 1, 2021, the disclosures of all of which are hereby incorporated by reference in their entireties.

BACKGROUND

Surface emitting lasers, i.e., laser devices in which the generated laser light is emitted perpendicular to a surface of a semiconductor layer array, may be used in a wide variety of applications, for example in AR ("augmented reality") applications or in 3D sensor systems, for example for face recognition or distance measurement in autonomous driving, or for general illumination purposes, for example for display devices.

In general, efforts are being made to improve such surface-emitting lasers.

It is an object of the present invention to provide an improved surface-emitting semiconductor laser and an improved method of manufacturing a surface-emitting semiconductor laser.

According to embodiments, the object is achieved by the device and the method of the independent patent claims.

SUMMARY

A surface-emitting semiconductor laser comprises a first semiconductor layer of a first conductivity type, an active zone adapted to generate electromagnetic radiation, an ordered photonic structure, and a second semiconductor layer of a second conductivity type. The active zone is disposed between the first and second semiconductor layers, the ordered photonic structure is formed in the first semiconductor layer, and a part of the first semiconductor layer is adjacent to both sides of the ordered photonic structure, or the ordered photonic structure is disposed in an additional semiconductor layer between the active zone and the second semiconductor layer, wherein a part of the additional semiconductor layer is disposed between the ordered photonic structure and the second semiconductor layer.

For example, the ordered photonic structure comprises a plurality of voids in the first semiconductor layer or in the additional semiconductor layer. According to embodiments, the voids may be filled with dielectric material. For example, an emission of generated laser radiation is effected via a first main surface of the first semiconductor layer.

According to embodiments, the surface emitting semiconductor laser further comprises a mirror layer on a side of the second semiconductor layer facing away from the active zone.

A method of manufacturing a surface-emitting semiconductor laser comprises forming a first semiconductor layer of a first conductivity type over a growth substrate, forming a hardmask layer over the first semiconductor layer, patterning the hard mask layer such that regions of a surface of a semiconductor layer adjacent to the hardmask layer are exposed and adapted to define an ordered photonic structure in a subsequently grown additional semiconductor material. The method further comprises growing the additional semiconductor material over the exposed regions of the semiconductor layer adjacent to the hard mask layer, removing the hardmask layer, leaving grown patterned semiconductor regions which form an ordered photonic structure, and growing the additional semiconductor material, thereby overgrowing the patterned semiconductor regions with the additional semiconductor material. The method further comprises forming an active zone adapted to generate electromagnetic radiation.

For example, the active zone may be formed prior to forming the hardmask layer, and the additional semiconductor material forms a second semiconductor layer of a second conductivity type.

For example, the hardmask layer may be formed adjacent to the active zone. According to further embodiments, the method may further comprise forming an intermediate layer after forming the active zone, wherein the hardmask layer is formed adjacent to the intermediate layer.

Alternatively, the active zone may be formed after growing the additional semiconductor material, wherein the hardmask layer is formed adjacent to the first semiconductor layer. The method may further comprise forming a second semiconductor layer of a second conductivity type.

According to further embodiments, a surface-emitting semiconductor laser comprises a plurality of pixels, each of the pixels comprising a first semiconductor layer of a first conductivity type, an active zone adapted to generate electromagnetic radiation, an ordered photonic structure, and a second semiconductor layer of a second conductivity type. The active zone is disposed between the first semiconductor layer and the second semiconductor layer, and the ordered photonic structure is disposed between the active zone and the first semiconductor layer or the second semiconductor layer. The ordered photonic structure of a first pixel is different from the ordered photonic structure of a second pixel.

For example, the ordered photonic structure of the first pixel is adapted to produce a radiation pattern of the emitted laser radiation different from that of the ordered photonic structure of the second pixel. According to embodiments, the pixels are arranged over a common carrier.

For example, the size of each pixel is larger than 10 μm.

The surface-emitting semiconductor laser may further include beam-shaping optics adapted to shape emitted electromagnetic radiation.

According to further embodiments, a surface-emitting semiconductor laser comprises a first n-doped semiconductor layer, an ordered photonic structure, an active zone adapted to generate electromagnetic radiation, a second p-doped semiconductor layer, and a third n-doped semiconductor layer. The surface-emitting semiconductor laser further comprises a tunnel junction adapted to electrically connect the second p-doped semiconductor layer to the third n-doped semiconductor layer. The active zone is disposed between the second p-doped semiconductor layer and the first n-doped semiconductor layer. The ordered photonic structure is formed in the first or the third n-doped semiconductor layer.

According to further embodiments, a laser device comprises an array of a plurality of surface-emitting semiconductor laser elements. Each of the semiconductor laser elements comprises a first semiconductor layer of a first conductivity type, and an active zone adapted to generate electromagnetic radiation. The array further comprises an ordered photonic structure, a second semiconductor layer of a second conductivity type, a first and a second contact element. The ordered photonic structure and the second semiconductor layer are associated with at least two semiconductor laser elements. The second contact element is electrically connected to the second semiconductor layer. The active zone is disposed between the first semiconductor layer and the second semiconductor layer. The ordered photonic structure is disposed between the active zone and the second contact element.

For example, a horizontal dimension of each of the semiconductor laser elements may be less than 10 μm. A horizontal dimension of the ordered photonic structure may be larger than 10 μm.

For example, the active zones of the individual semiconductor laser elements are electrically isolated from each other, and a filling material is disposed in a gap between adjacent semiconductor laser elements.

According to embodiments, the second semiconductor layer is adjacent to the second contact element, and the ordered photonic structure is disposed in the second semiconductor layer.

For example, the laser device may further comprise a third semiconductor layer of the first conductivity type adjacent to the second contact element and a tunnel junction adapted to electrically connect the second semiconductor layer to the third semiconductor layer, wherein the ordered photonic structure is disposed in the third semiconductor layer.

BRIEF DESCRIPTION OF THE DRAWINGS

The accompanying drawings serve to provide an understanding of exemplary embodiments of the invention. The drawings illustrate exemplary embodiments and, together with the description, serve for explanation thereof. Further exemplary embodiments and many of the intended advantages will become apparent directly from the following detailed description. The elements and structures shown in the drawings are not necessarily shown to scale relative to each other. Like reference numerals refer to like or corresponding elements and structures.

DETAILED DESCRIPTION

Figure 1:
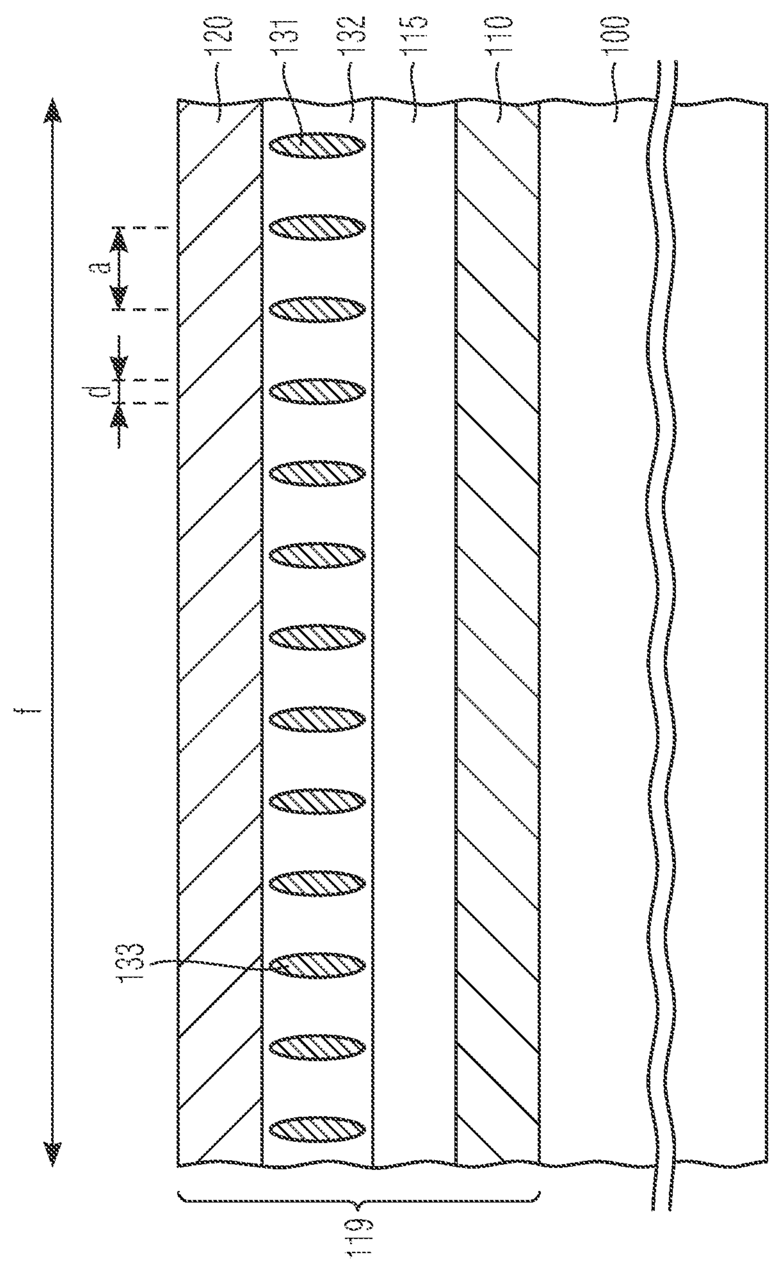
FIG. 1 shows a general structure of a surface-emitting semiconductor laser comprising an ordered photonic structure.

In the following detailed description, reference is made to the accompanying drawings, which form a part of the disclosure and in which specific exemplary embodiments are shown for purposes of illustration. In this context, directional terminology such as "top", "bottom", "front", "back", "over", "on", "in front", "behind", "leading", "trailing", etc. refers to the orientation of the figures just described. As the components of the exemplary embodiments may be positioned in different orientations, the directional terminology is used by way of explanation only and is in no way intended to be limiting.

The description of the exemplary embodiments is not limiting, since other exemplary embodiments may also exist and structural or logical changes may be made without departing from the scope as defined by the patent claims. In particular, elements of the exemplary embodiments described below may be combined with elements from others of the exemplary embodiments described, unless the context indicates otherwise.

The terms "wafer" or "semiconductor substrate" used in the following description may include any semiconductor-based structure that has a semiconductor surface. Wafer and structure are to be understood to include doped and undoped semiconductors, epitaxial semiconductor layers, supported by a base, if applicable, and further semiconductor structures. For example, a layer of a first semiconductor material may be grown on a growth substrate made of a second semiconductor material, for example a GaAs substrate, a GaN substrate, or an Si substrate, or of an insulating material, for example sapphire.

Depending on the intended use, the semiconductor may be based on a direct or an indirect semiconductor material. Examples of semiconductor materials particularly suitable for generating electromagnetic radiation include, without limitation, nitride semiconductor compounds by means of which, for example, ultraviolet, blue or longer-wave light may be generated, such as GaN, InGaN, AlN, AlGaN, AlGaInN, AlGaInBN; phosphide semiconductor compounds by means of which, for example, green or longer-wave light may be generated, such as GaAsP, AlGaInP, GaP, AlGaP; and other semiconductor materials such as GaAs, AlGaAs, InGaAs, AlInGaAs, SiC, ZnSe, ZnO, $Ga_2O_3$, diamond, hexagonal BN; and combinations of the materials mentioned. The stoichiometric ratio of the compound semiconductor materials may vary. Other examples of semiconductor materials may include silicon, silicon germanium, and germanium. In the context of the present description, the term "semiconductor" also includes organic semiconductor materials.

The term "substrate" generally includes insulating, conductive or semiconductor substrates.

The term "vertical" as used in this description is intended to describe an orientation which is essentially perpendicular to the first surface of the semiconductor substrate or semiconductor body. The vertical direction may correspond, for example, to a direction of growth when layers are grown.

The terms "lateral" and "horizontal", as used in the present description, are intended to describe an orientation or alignment which extends essentially parallel to a first surface of a substrate or semiconductor body. This may be the surface of a wafer or a chip (die), for example.

The horizontal direction may, for example, be in a plane perpendicular to a direction of growth when layers are grown.

In the context of this description, the term "electrically connected" means a low-ohmic electrical connection between the connected elements. The electrically connected elements need not necessarily be directly connected to one another. Further elements may be arranged between electrically connected elements.

The term "electrically connected" also encompasses tunnel contacts between the connected elements.

FIG. 1 shows a schematic cross-sectional view of a general surface-emitting semiconductor laser comprising an ordered photonic structure or a photonic crystal (PCSEL), for the purpose of explaining its structure and operation. The features and operation described herein apply to the surface-emitting laser devices described below in accordance with all embodiments, unless explicitly indicated otherwise.

A semiconductor body 119 is disposed over a suitable substrate 100, for example a growth substrate. The semiconductor body 119 comprises a semiconductor layer stack. The semiconductor layer stack comprises, for example, a first semiconductor layer 110 of a first conductivity type, for example n-type, and a second semiconductor layer 120 of a second conductivity type, for example p-type. An active zone for generating radiation 115 is disposed between the first and second semiconductor layers 110, 120.

The active zone may, for example, comprise a pn junction, a double heterostructure, a single quantum well structure (SQW, single quantum well), or a multiple quantum well structure (MQW, multi quantum well) for generating radiation. The term "quantum well structure" does not imply any particular meaning here with regard to the dimensionality of the quantization. Therefore, it includes, among other things, quantum wells, quantum wires and quantum dots as well as any combination of these layers.

In addition, a semiconductor layer comprising an ordered photonic structure 132 is disposed within the semiconductor body 119. In general, the term "ordered photonic structure" refers to alternating regions each having a different refractive index, which may be formed, for example, by suitably patterning a semiconductor material. For example, voids 131 may be formed in a semiconductor material, for example by etching. For example, the voids 131 may be filled with a material 133 having a refractive index different from that of the surrounding semiconductor material. Furthermore, isolated semiconductor structures may be formed.

For example, the voids or the semiconductor structures may represent a lattice, such as a hexagonal lattice or other lattice. However, according to further embodiments, non-periodic patterns are also encompassed. Furthermore, a lattice having a non-strict periodicity may also be considered an ordered photonic structure. Generally, an average spacing between the voids or the semiconductor structures is predetermined. The position and size of the voids or structures is deterministic. For example, a distance a between the individual voids or the raised structures may be in the range of a quarter to one half of the wavelength, for example, between 80 and 560 nm. The structure sizes of the ordered photonic structure 132 depend on both the refractive index and the wavelength. For example, if a dielectric material is intercalated in the voids of the ordered photonic structure 132, the structure size depends on the difference in the refractive index. Generally, the lattice constant scales with both the wavelength and the refractive index of the material of the ordered photonic structure 132. For example, depending on both the wavelength and the refractive index, the lattice constant may be in the range of about 80 to 300 nm, for example 100 to 200 nm.

The size, for example the diameter, of the individual voids or structures may be in a range of 40 to 150 nm. For example, a size of the voids or dimensions in the growth direction may be greater than 100 nm, for example in a range of 100 to 300 nm. At a certain lateral dimension f of the ordered photonic structure 132, for example in a range of f of greater than 1 μm, a photonic crystal is formed by the ordered photonic structure. Accordingly, a photonic band structure of a specific reflection and transmission behavior depending on the wavelength is defined. Due to the specific reflection behavior of the layer comprising the ordered photonic structure 132, a surface-emitting semiconductor laser having the layer structure shown in FIG. 1 will emit a wavelength predetermined by the photonic band structure. For example, the spacing of the voids determines the photonic band structure and thus the emission wavelength of the semiconductor laser.

Accordingly, unlike conventional vertical-cavity surface-emitting semiconductor lasers (VCSELs), PCSELs do not have an optical resonator in which laser modes may be formed that are predetermined, for example, by the resonator length. Rather, in a PCSEL, the emission wavelength is determined by the photonic band structure. In a corresponding manner, no mirror is required to form an optical resonator. A mirror may be provided as an optional component. Since in a PCSEL the emission wavelength is determined by the photonic band structure, laser emission takes place immediately in a PCSEL. In contrast to a VCSEL, no spontaneous emission which is displaced by induced emission during operation occurs initially during operation of the PCSEL. Accordingly, such laser devices may be switched very quickly. For example, this enables pure pulse width modulation as an operating mode. Furthermore, they may additionally be coupled to an analog controller. Since the wavelength is primarily defined by the ordered photonic structure, the emission wavelength may be kept stable. For example, it is possible that the emission wavelength does not change or changes only slightly when the impressed current or the temperature changes.

Figure 2:
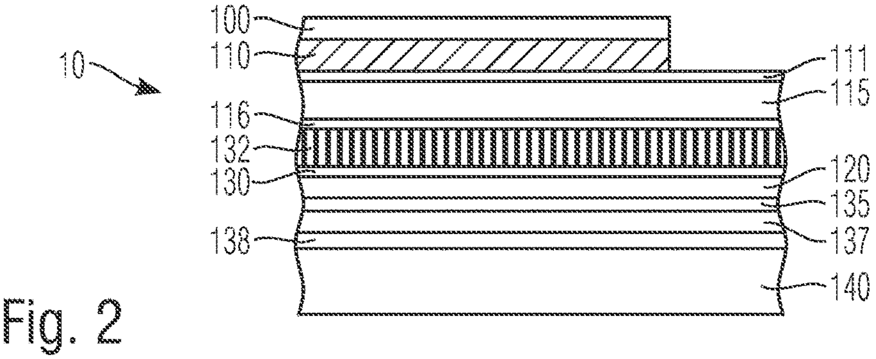
FIG. 2 shows a schematic cross-sectional view of a surface-emitting semiconductor laser according to embodiments.

FIG. 2 shows a schematic cross-sectional view of a surface-emitting semiconductor laser 10 according to embodiments. The surface-emitting semiconductor laser includes a carrier 140, for example made of a semiconductor material, an insulating material, or a conductive material selected according to the field of application of the semiconductor laser. An insulating layer 138 may be disposed over the substrate 140. A metallic mirror layer 137, for example a silver layer 137, may be disposed over the insulating layer 138. Next, a dielectric mirror layer 135 may be disposed over the metallic mirror 137.

In general, the term "dielectric mirror layer" comprises any arrangement that reflects incident electromagnetic radiation to a large degree (for example >90%) and is non-conductive. For example, a dielectric mirror layer may be formed by a sequence of very thin dielectric layers, each of a different refractive index. For example, the layers may have alternating high refractive indices (n>1.7) and low refractive indices (n<1.7), and may be formed as Bragg reflectors. For example, the layer thickness may be $\lambda/4$, with $\lambda$ indicating the wavelength of the light to be reflected in the respective medium. The layer as seen from the perspective of the incident light may have a larger layer thickness, for example $3\lambda/4$.

Due to the small layer thickness and the difference between the respective refractive indices, the dielectric mirror layer provides high reflectivity and is non-conductive at the same time. The dielectric mirror layer is thus suitable for isolating components of the semiconductor device from each other. For example, a dielectric mirror layer may have 2 to 50 dielectric layers. A typical layer thickness of the individual layers may be about 30 to 90 nm, for example about 50 nm. The layer stack may further include one or two or more layers thicker than about 180 nm, for example thicker than 200 nm.

A second semiconductor layer 120 of a second conductivity type, for example p-type, is disposed over the dielectric mirror layer 135. An additional semiconductor layer 130 is disposed over the second semiconductor layer 120. The additional semiconductor layer 130 may be of the second conductivity type also, for example. For example, the additional semiconductor layer 130 has the same or a different composition from the second semiconductor layer 120. An ordered photonic structure 132 is disposed in the additional semiconductor layer 130. Furthermore, a protective layer 116 is disposed over the ordered photonic structure 132. A first semiconductor layer 110 of a first conductivity type, such as n-type, is disposed over the protective layer 116. Moreover, an active zone 115 is disposed between the first semiconductor layer 110 and the second semiconductor layer 120. The protective layer 116 is optional. Furthermore, a growth substrate 100 may be disposed over the first semiconductor layer 110, for example.

As illustrated in FIG. 2, a surface-emitting semiconductor laser comprises a first semiconductor layer 110 of a first conductivity type, an active zone 115 adapted to generate electromagnetic radiation, an ordered photonic structure 132, and a second semiconductor layer 120 of a second conductivity type. The active zone 115 is disposed between the first and second semiconductor layers 110, 120. As shown in FIG. 2, the ordered photonic structure is disposed in an additional semiconductor layer 130 between the active zone 115 and the second semiconductor layer 120. Furthermore, a part of the additional semiconductor layer 130 is disposed between the ordered photonic structure 132 and the second semiconductor layer 120.

As further shown in FIG. 2, the ordered photonic structure 132 comprises a plurality of voids in the additional semiconductor layer 130. For example, the voids of the ordered photonic structure 132 may be filled with a material having a lower refractive index, such as a dielectric. For example, the additional semiconductor layer 130 may comprise a GaN-containing layer. However, the additional semiconductor layer 130 may be selected from another material system and may include GaAs or InP, for example. Examples of a material for filling the voids include $SiO_2$ or $Si_3N_4$, for example. As further shown in FIG. 2, the surface-emitting semiconductor laser 10 may further include a mirror layer 135, 137 on a side of the second semiconductor layer 120 facing away from the active zone 115.

Figure 3A:
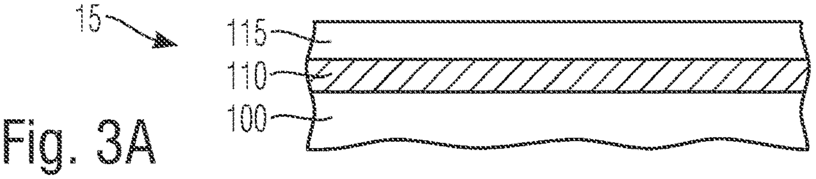
FIGS. 3A to 3I illustrate cross-sectional views of a workpiece in the course of performing a method according to embodiments.

A method of manufacturing the surface-emitting semiconductor laser 10 is described below. FIG. 3A shows a workpiece 15 comprising a suitable growth substrate 100, a first semiconductor layer 110, and the active zone 115. For example, the growth substrate may be GaN, and the first semiconductor layer 110 may include GaN-containing layers. The first semiconductor layer 110 as well as the layers of the active zone 115 may have been epitaxially grown over the growth substrate 100.

Figure 3B:
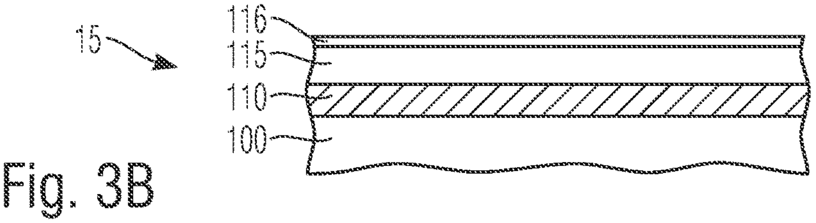

As shown in FIG. 3B, a thin intermediate layer or protective layer 116, for example made of SiO, SiN, AlO, AlN, or a combination of these materials may be grown over the active zone 115, if necessary. The protective layer 116 protects the layers of the active zone 115, for example the quantum well layers of the active zone, during subsequent patterning. The material of the intermediate layer 116 should be selected to withstand subsequent growth processes.

Figure 3C:
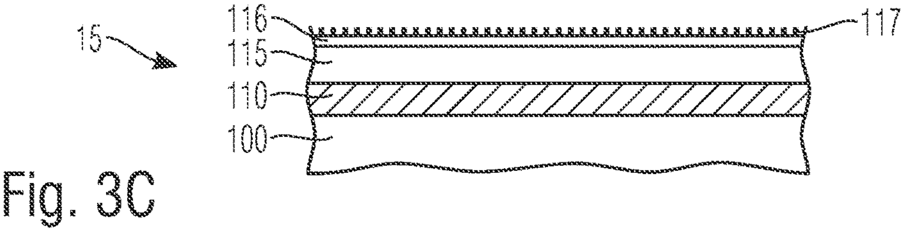

Next, as shown in FIG. 3C, a hardmask layer, which may include SiO or SiN, for example, is deposited over the protective layer 116. The hardmask is then patterned, for example using a lift-off process in which the hardmask layer is deposited over a patterned photoresist layer. By dissolving the photoresist material in a solvent, the portions of the hardmask over the photoresist portions are removed.

FIG. 3C shows an example of a resulting workpiece 15. A hardmask 117 is disposed over the surface of the optional protective layer 116. As will be explained below, in a subsequent growth process for epitaxially growing semiconductor material, no growth process will occur at the regions covered by the hardmask. The means that the areas covered by hardmask material will define the voids to be formed in the semiconductor layer. The width and spacing of the hardmask regions are selected according to the size and spacing of the voids to be formed in the semiconductor material to be grown.

Figure 3D:
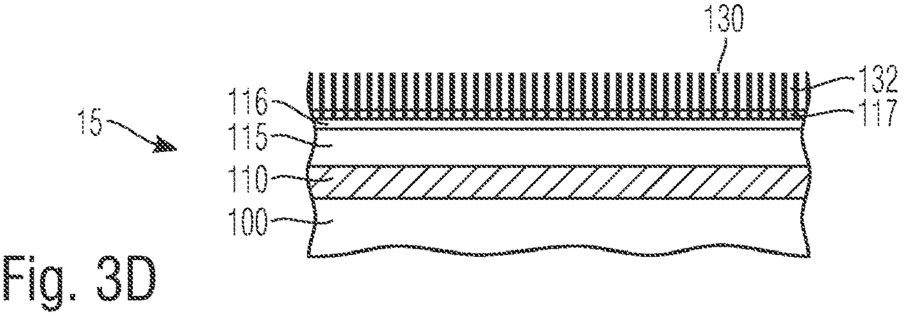

In the following, as shown in FIG. 3D, a process for epitaxially growing the semiconductor layer 130 takes place. The semiconductor layer 130 may be a GaN-containing semiconductor layer, for example. According to embodiments, conditions during growth of the semiconductor layer 130 may be suitably adjusted such that a flank angle is adjustable. For example, vertical or defined inclined flanks may be generated. This may be achieved, for example, by adjusting the pressure and temperature during the growth process. The growth conditions may also be varied during the growth of the layer 130, so that a stepped sequence of different angles may be set. For example, the layer 130 may be grown to a layer thickness that corresponds approximately to a vertical dimension of the voids to be formed. For example, the layer thickness may be 100 to 500 nm.

Figure 3E:
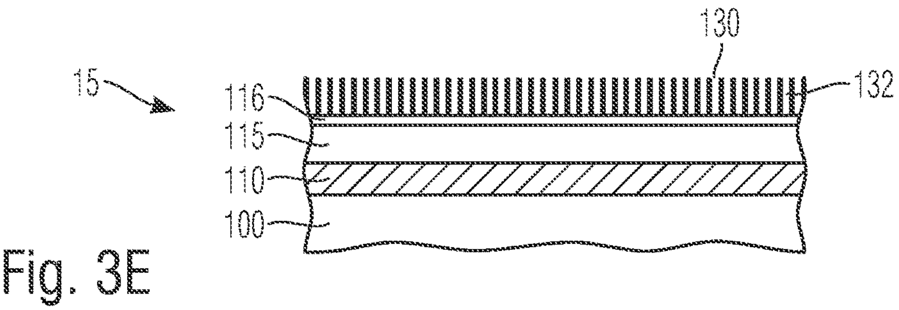

The hardmask may then be removed, for example by a selective etching process. FIG. 3E shows an example of a cross-sectional view of a workpiece after removal of the hardmask material. If necessary, the voids may now be filled with a material of a lower refractive index, for example a dielectric. For example, the material may be $SiO_2$ or SiN, or a mixture of these materials.

Then, growth of the semiconductor layer 130 is continued. The growth parameters are changed from those during the growth of the ordered photonic structure 132 as shown in FIG. 3D. As a result, the voids of the ordered photonic structure 132 are overgrown, so that a continuous semiconductor layer 130 is formed.

Figure 3F:
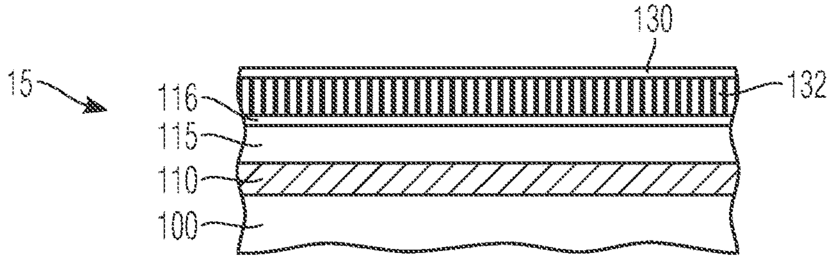

FIG. 3F shows an example of a resulting workpiece 15. Subsequently, additional semiconductor layers are epitaxially grown to complete the semiconductor laser. For example, a second semiconductor layer 120 of a second conductivity type, such as p-type, may be grown. The second semiconductor layer 120 may again include GaN.

Figure 3G:
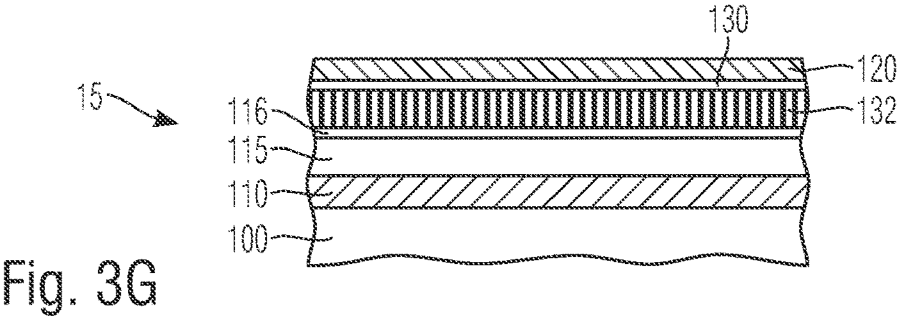

FIG. 3G shows an example of a resulting workpiece 15.

Figure 3H:
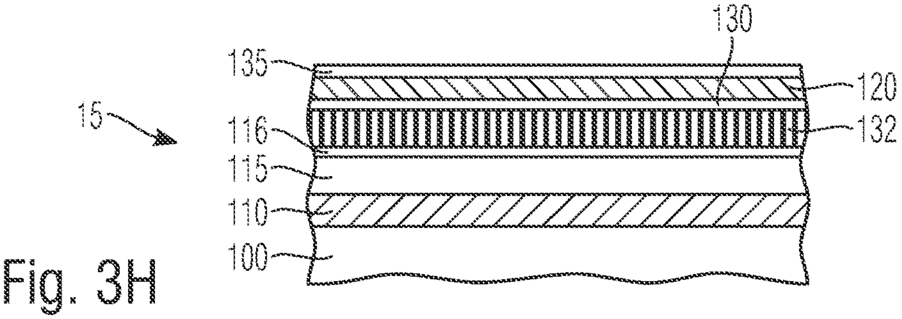

Subsequently, as illustrated in FIG. 3H, a dielectric mirror layer 135 may be deposited. The dielectric mirror layer may include, for example, ITO and/or NbO/SiO, for example alternating layers comprising NbO or SiO. Using an NbO/SiO mirror, in particular, radiation of shallow angles of incidence is efficiently reflected. According to embodiments, contact voids may further be formed in the dielectric mirror layer 137 for improved electrical contacting of the second semiconductor layer 120. Subsequently, a metallic mirror layer 137 may be deposited. For example, the metallic mirror layer 137 may include or be made of silver. In combination with the dielectric mirror 135, the efficiency of the semiconductor laser may be significantly improved because even radiation emitted into the lower half-space, i.e., toward the dielectric mirror layer 135, may also be used.

Figure 3I:
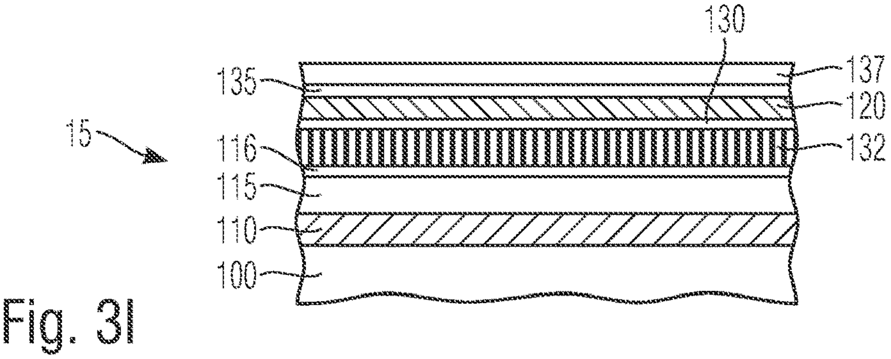

FIG. 3I shows a cross-sectional view of a resulting workpiece 15. Subsequently, for example, an insulating layer 138, for example an oxide, may be deposited, if necessary. The workpiece 15 is permanently bonded to a carrier 140. The growth substrate may subsequently be at least partially removed. For example, the growth substrate 100 may be removed by grinding and polishing or by peeling at a 2D layer such as graphene. Such processes are well known and will not be discussed in detail herein. Furthermore, a part of the remaining growth substrate 100 and a part of the first semiconductor layer 110 may be removed to expose a part of a first main surface 111 of the first semiconductor layer 110. A first contact element 112 for electrically contacting the first semiconductor layer 110 may be formed on this exposed part of the first main surface 111. As a result, for example, the structure shown in FIG. 2 may be obtained.

Figure 4:
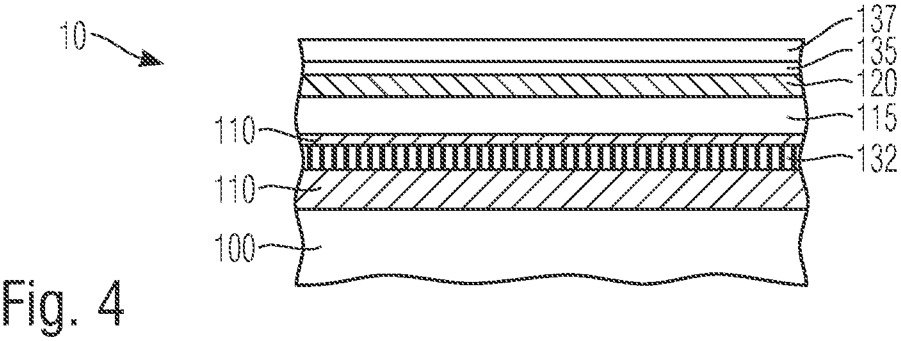
FIG. 4 shows a schematic cross-sectional view of a surface-emitting semiconductor laser according to further embodiments.

FIG. 4 shows a surface-emitting semiconductor laser according to further embodiments. The surface-emitting semiconductor laser 10 shown in FIG. 4 comprises a first semiconductor layer 110 of a first conductivity type, for example n-type, an active zone 115 adapted to generate electromagnetic radiation, an ordered photonic structure 132, and a second semiconductor layer 120 of a second conductivity type, for example p-type. The active zone 115 is disposed between the first and second semiconductor layers 110, 120. The ordered photonic structure 132 is formed in the first semiconductor layer 110. A part of the first semiconductor layer 110 is adjacent to both sides of the ordered photonic structure 132. For example, the ordered photonic structure 132 may be formed by a plurality of voids in a region of the first semiconductor layer 110.

Differing from embodiments such as the one shown in FIG. 2, for example, forming the ordered photonic structure 132 in the n-type semiconductor layer 110 results in the advantage of higher mobility of the charge carriers, resulting in reduced forward voltage and more homogeneous current distribution.

In order to manufacture the surface-emitting semiconductor laser shown in FIG. 4, a first semiconductor layer 110 of a first conductivity type, for example n-type, is formed over a suitable growth substrate 100, for example a GaN substrate.

Figure 5A:
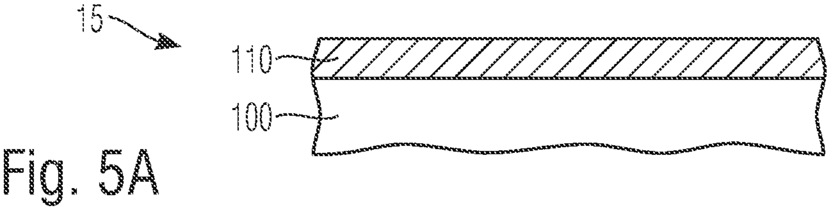
FIGS. 5A to 5F illustrate cross-sectional views of a workpiece in the course of performing a method according to further embodiments.

FIG. 5A shows a cross-sectional view of the resulting workpiece 15. A hardmask 117 is then formed over the first semiconductor layer 110. The hardmask may again be formed using a lift-off process or by etching using a patterned photoresist mask.

Figure 5B:
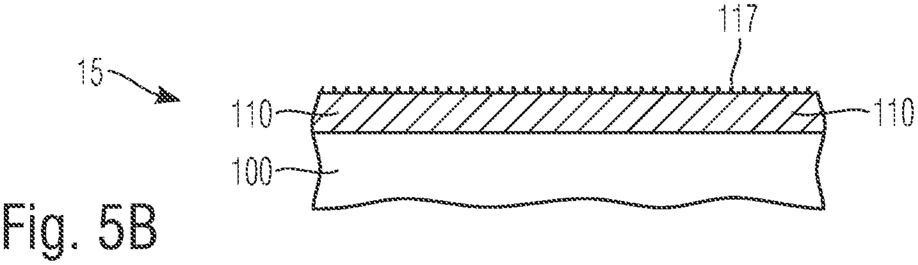

FIG. 5B shows a cross-sectional view of a resulting workpiece 15. An epitaxial growth process is then performed to further grow the first semiconductor layer 110. Due to the formation of the patterned hardmask, those regions of the surface of the layer 110 on which no layer growth occurs are covered by the hardmask 117, so that voids are formed in the resulting layer. The conditions during growth of the semiconductor material, in particular pressure and temperature, determine the flank angle. Accordingly, vertical or defined oblique flanks may be produced. By changing the conditions, a stepped sequence of different angles may be achieved.

Figure 5C:
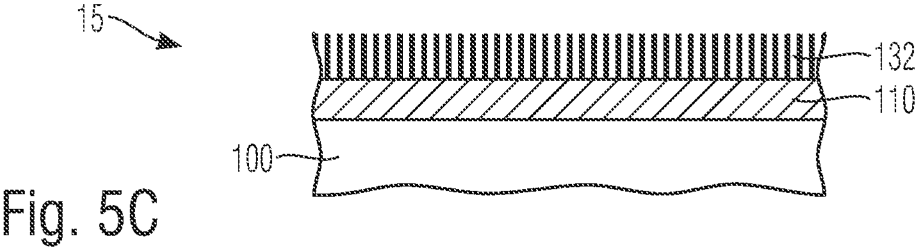
Figure 5D:
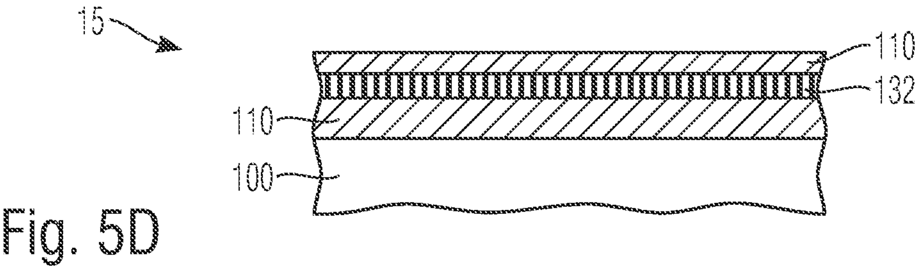

FIG. 5C shows an example of a resulting workpiece 15. Subsequently, the first semiconductor layer 110 may be grown, for example by changing the growth conditions, such that the layer over the voids in the ordered photonic structure 132 becomes continuous. For example, the hardmask may be overgrown during this growth process. Subsequently, the active zone 115 is formed, for example by depositing the corresponding layers.

Figure 5E:
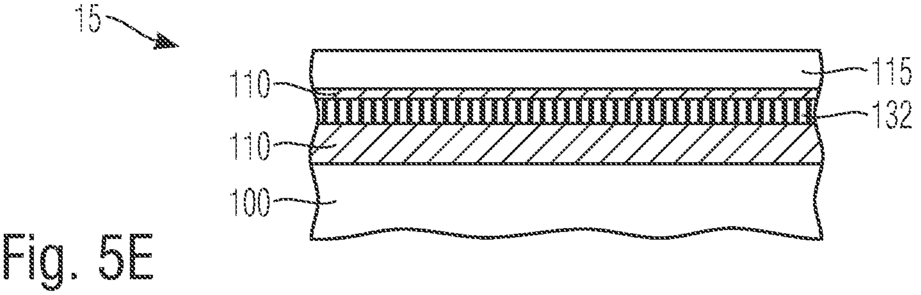
Figure 5F:
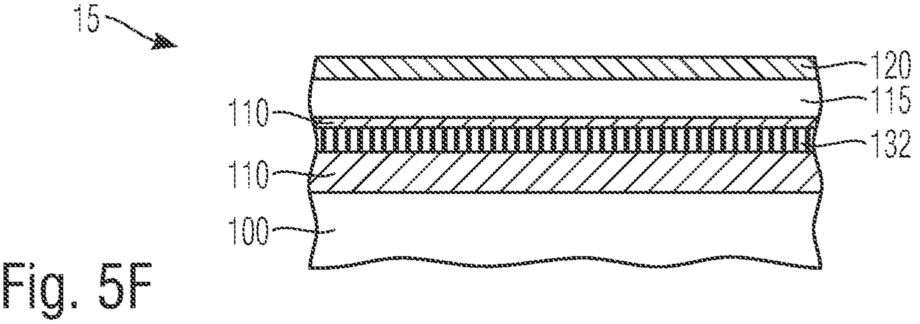

FIG. 5E shows a cross-sectional view of a resulting workpiece. Subsequently, the second semiconductor layer 120 of the second conductivity type, for example p-type, is grown. FIG. 5F shows a cross-sectional view of a resulting workpiece 15. Subsequently, the dielectric mirror layer 135 and the metallic mirror layer 137 may be formed over the second semiconductor layer 120. This may be done, for example, in the manner described with reference to FIG. 3H. As a result, for example, the surface-emitting semiconductor laser structure shown in FIG. 4 may be obtained.

Figure 6A:
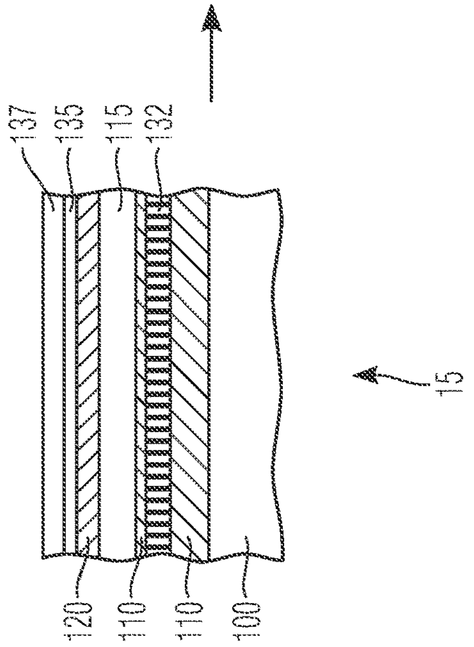
FIGS. 6A to 6C illustrate cross-sectional views of a workpiece in the course of further processing according to embodiments.
Figure 6B:
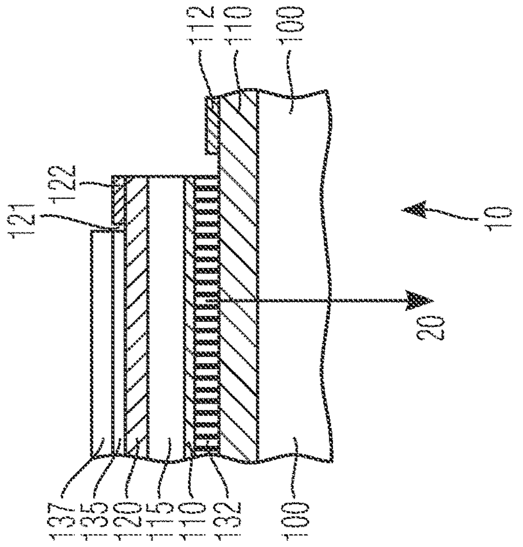

In order to form electrical contacts, for example starting from the structure shown in FIG. 6A, part of the epitaxially grown layers may be removed, for example by etching. The etching depth may be determined such that the ordered photonic structure is removed. As a result, a region of a first main surface 111 of the first semiconductor layer 110 is exposed. This is illustrated in FIG. 6B. Subsequently, a first contact element 112 may be formed over the first main surface 111 of the first semiconductor layer 110. Furthermore, a part of the dielectric mirror layer 135 and the metallic mirror layer 137 may be removed to expose a part of the first main surface 121 of the second semiconductor layer 120. The second contact element 122 may be formed over this part.

Figure 6C:
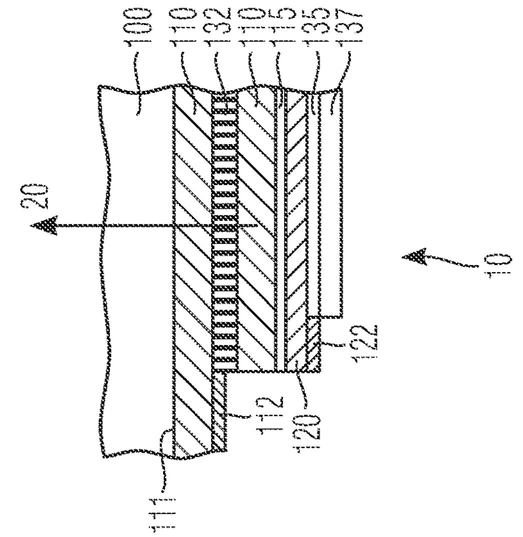

As shown in FIG. 6C, the surface-emitting semiconductor laser 10 may then be deposited on a suitable carrier (not shown), with, for example, the metallic mirror layer 137 disposed between the semiconductor laser 10 and the carrier. For example, corresponding contacts may be provided on this carrier. Emission of the generated electromagnetic radiation 20 may be performed via the first semiconductor layer 110 and, if necessary, the substrate 100. This is illustrated in FIG. 6C. In embodiments shown in FIG. 6C, the ordered photonic structure 132 is further away from the active zone 115 than in embodiments illustrated in, for example, FIG. 6A or 6B. As a result, the active zone may be grown at better epitaxial quality.

Alternatively, starting from the structure shown in FIG. 6A, the first contact element 112 may also be placed above the ordered photonic structure 132. This is illustrated in FIG. 6D. As shown in FIG. 6D, the layers are etched back over a part of the first main surface 111 of the semiconductor layer 110. The first semiconductor layer 110 is etched only insignificantly so that the ordered photonic structure 132 is preserved. Furthermore, a second contact element 122 may be formed over the metallic mirror layer 137. In this case, for example, the second semiconductor layer 120 may be contacted through via contacts 139 extending through the dielectric mirror layer 135.

The surface-emitting semiconductor laser 10 may be deposited on a suitable carrier such that, for example, the second contact element 122 is adjacent to the carrier. In this case, the generated electromagnetic radiation 20 is emitted via the first semiconductor layer 110 and, optionally, the growth substrate 100, as indicated in FIG. 6E.

Figure 6E:
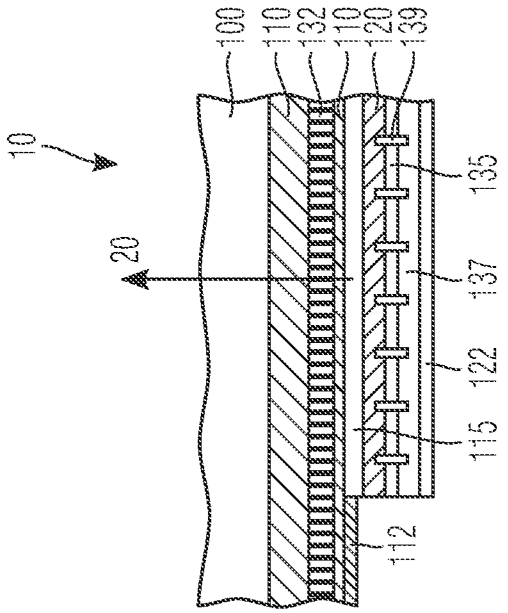
FIGS. 6D and 6E show cross-sectional views of a workpiece for the purpose of illustrating method variations.
Figure 6D:
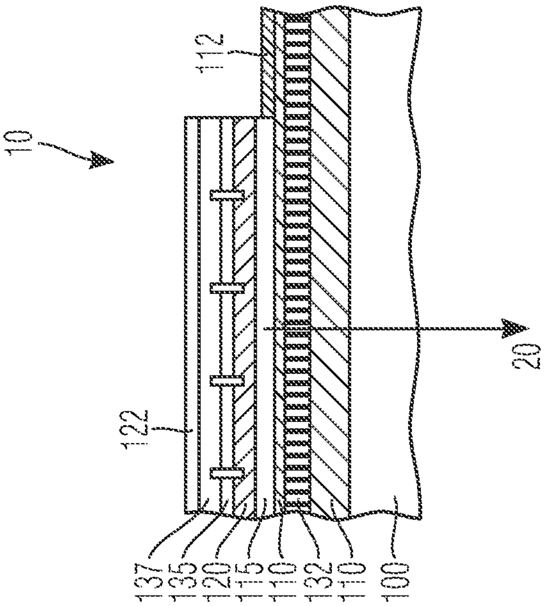

In embodiments shown, for example, in FIGS. 6D and 6E, the distance of the ordered photonic structure 132 from the active zone 115 is smaller than in embodiments shown, for example, in FIG. 6C. As a result, the impact of the ordered photonic structure on light emission in the active zone may be enhanced.

The contacting options shown in FIGS. 6B and 6D may be combined with each other. For example, the first contact element 112 shown in FIG. 6B may be combined with the second contact element 122 shown in FIG. 6D and vice versa.

Figure 7:
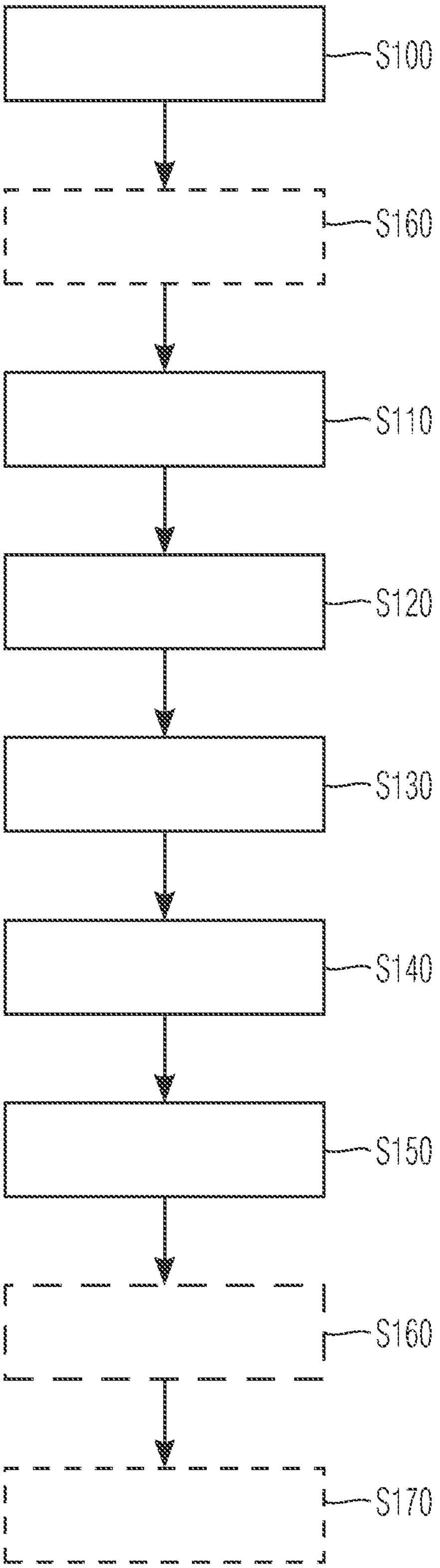
FIG. 7 outlines a method according to embodiments.

FIG. 7 outlines a method according to embodiments. A method of manufacturing a surface-emitting semiconductor laser comprises forming (S100) a first semiconductor layer of a first conductivity type over a growth substrate, forming (S110) a hardmask layer over the first semiconductor layer, and patterning (S120) the hardmask layer such that regions of a surface of a semiconductor layer adjacent to the hardmask layer are exposed and adapted to define an ordered photonic structure in a subsequently grown additional semiconductor material. The method further comprises growing (S130) the additional semiconductor material over the exposed regions of the semiconductor layer adjacent to the hardmask layer, removing (S140) the hardmask layer, leaving grown patterned semiconductor regions which form an ordered photonic structure, and growing (S150) the additional semiconductor material, thereby overgrowing the patterned semiconductor regions with the additional semiconductor material. The method further comprises forming (S160) an active zone adapted to generate electromagnetic radiation.

For example, the active zone may be formed prior to forming the hardmask layer. In this case, the additional semiconductor material may be a second semiconductor layer of a second conductivity type.

For example, the hardmask layer is formed adjacent to the active zone. However, the method may further comprise forming an intermediate layer after forming the active zone. In this case, the hardmask layer may be formed adjacent to the intermediate layer.

According to further embodiments, the active zone may be formed after the additional semiconductor material is grown. In this case, for example, the hardmask layer may be formed adjacent to the first semiconductor layer. The method may further comprise forming (S170) a second semiconductor layer of a second conductivity type.

Using the method described herein, an ordered photonic structure may be manufactured with great precision. In particular, for applications in the blue or green spectral ranges of the GaN material system, the required structure size may be manufactured with great accuracy. As a result, a surface-emitting laser with an ordered photonic structure may be realized even for the GaN material system. Thus, a surface-emitting semiconductor laser in the blue or green spectral ranges may be provided without the need to epitaxially grow suitable mirror layers.

The patterning of the ordered photonic structure is determined by the patterning of the hardmask. For example, the hardmask may be patterned into a variety of possible patterns. For example, the hardmask may be patterned to produce arbitrary deviations from a strictly periodic pattern. Such deviations include, for example, deviations from a strictly periodic arrangement position or differing diameters of the generated voids. Furthermore, it is possible to pattern a workpiece in such a way that a plurality of different juxtaposed ordered photonic structures is generated.

Figure 8A:
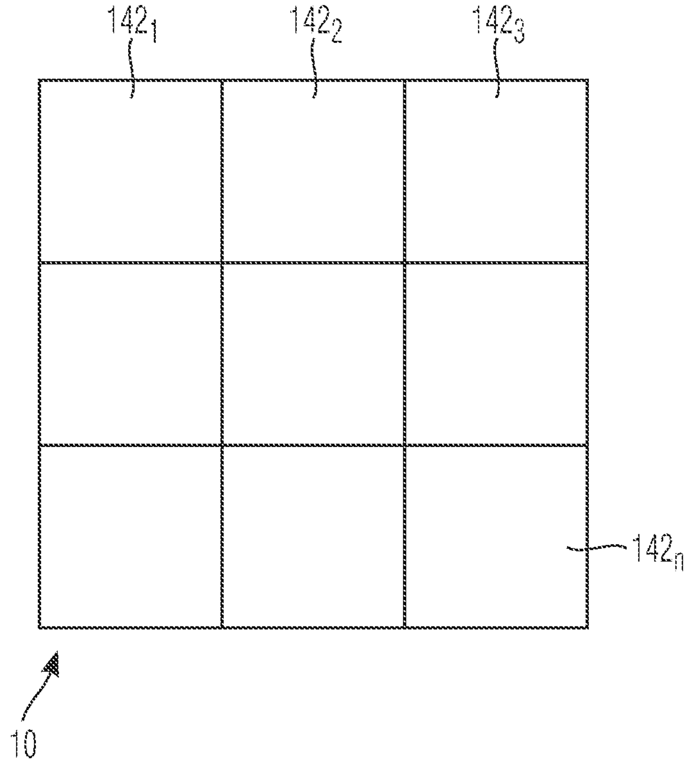
FIG. 8A shows a top view of a surface-emitting semiconductor laser according to embodiments.

FIG. 8A shows a top view of a surface-emitting semiconductor laser according to further embodiments. As shown in FIG. 8A, the surface-emitting semiconductor laser comprises a plurality of pixels $\mathbf{142}_1$, $\mathbf{142}_2$, . . . , $\mathbf{142}_n$.

Figure 8B:
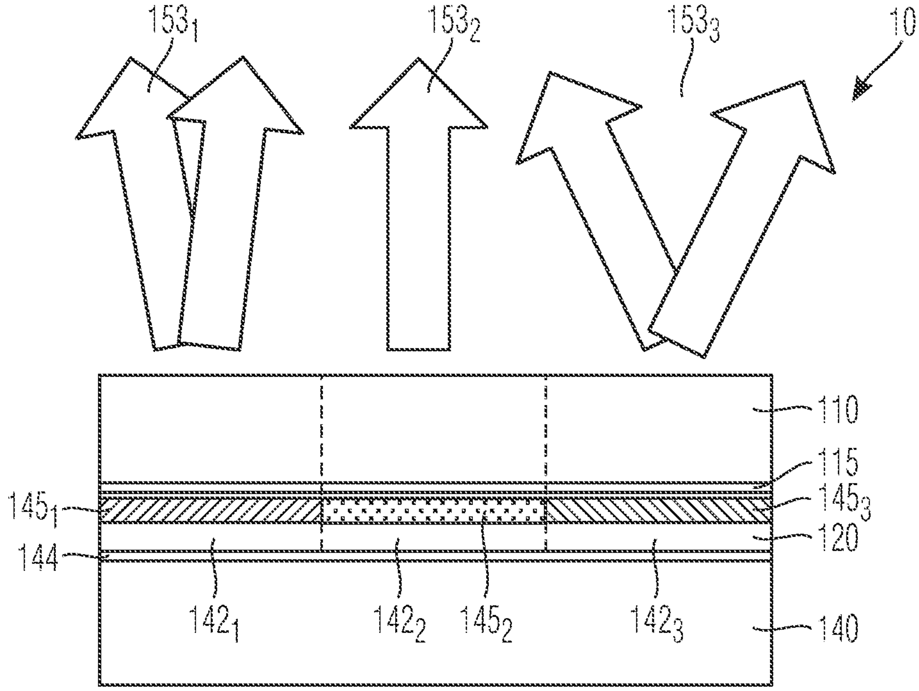
FIG. 8B shows a cross-sectional view of a surface-emitting semiconductor laser according to embodiments.

FIG. 8B shows a cross-sectional view through the surface-emitting semiconductor laser according to embodiments. As shown in FIG. 8B, each of the pixels $\mathbf{142}_1$, $\mathbf{142}_2$, $\mathbf{142}_3$ comprises a first semiconductor layer 110 of a first conductivity type, an active zone 115 adapted to generate electromagnetic radiation, an ordered photonic structure $\mathbf{145}_1$, $\mathbf{145}_2$, $\mathbf{145}_3$, and a second semiconductor layer 120 of a second conductivity type. The active zone 115 is in each case disposed between the first and second semiconductor layers 110, 120. The ordered photonic structure $\mathbf{145}_1$, $\mathbf{145}_2$, $\mathbf{145}_3$ is disposed between the active zone 115 and one of the first and second semiconductor layers 110, 120. Moreover, the ordered photonic structure $\mathbf{145}_1$ of a first pixel $\mathbf{142}_1$ is different from the ordered photonic structure $\mathbf{145}_2$ of a second pixel $\mathbf{142}_2$.

The first and second semiconductor layers 110, 120 and the active zone 115 may each be associated with a plurality of pixels 142.

For example, the ordered photonic structure $\mathbf{145}_1$, $\mathbf{145}_2$, $\mathbf{145}_3$ is respectively arranged in one part of the first semiconductor layer 110 and a part of the first semiconductor layer 110 is adjacent to both sides of the ordered photonic structure $\mathbf{145}_1$, $\mathbf{145}_2$, $\mathbf{145}_3$, respectively, or is arranged on a side of the ordered photonic structure $\mathbf{145}_1$, $\mathbf{145}_2$, $\mathbf{145}_3$ facing away from the second semiconductor layer 120. According to further embodiments, the ordered photonic structure $\mathbf{145}_1$, $\mathbf{145}_2$, $\mathbf{145}_3$ is respectively arranged in one part of the second semiconductor layer 120, and a part of the second semiconductor layer 120 is adjacent to both sides of the ordered photonic structure $\mathbf{145}_1$, $\mathbf{145}_2$, $\mathbf{145}_3$, respectively, or is arranged on a side of the ordered photonic structure $\mathbf{145}_1$, $\mathbf{145}_2$, $\mathbf{145}_3$ facing away from the first semiconductor layer 110.

As shown in FIG. 8B, the ordered photonic structure $\mathbf{145}_1$ is different from the ordered photonic structure $\mathbf{145}_2$. Furthermore, the second ordered photonic structure $\mathbf{145}_2$ is different from the ordered photonic structure $\mathbf{145}_3$. Accordingly, the radiation pattern 1531 of the first picture element $\mathbf{142}_1$ is different from the radiation pattern $\mathbf{153}_2$ of the second picture element $\mathbf{142}_2$. Furthermore, the radiation characteristic $\mathbf{153}_2$ of the second picture element $\mathbf{142}_2$ is different from the radiation characteristic $\mathbf{153}_3$ of the third picture element $\mathbf{142}_3$.

The term "a first ordered photonic structure is different from a second photonic structure" may mean that the positions of the generated voids may be locally shifted, for example. For example, a periodicity of the arranged voids may be maintained, but predetermined voids are shifted with respect to the predetermined arrangement position. According to further embodiments, this may also mean that the size or shape of the voids is changed without the predetermined spacing being changed, for example.

For example, a lateral dimension of the pixels may be greater than 10 μm.

Due to the fact that the ordered photonic structures of at least two picture elements are different from each other, a different radiation characteristic may be respectively generated by the corresponding picture elements. More precisely, the individual regions each radiate in a different direction. In this way, higher intensities may be realized in the fringe of the illumination area compared to components with, for example, respectively constant ordered photonic structures. The radiation direction is defined within the semiconductor chip by the specific geometry of the photonic structure 132. In particular, the lattice constant as well as the shape and size of the individual structural elements determine the respective radiation characteristics. As a consequence, for example when using a plurality of picture elements each with different ordered photonic structures, collimated radiation into arbitrary solid angles may be achieved by the surface emitting semiconductor laser 10. Emission occurs directly from the chip without additional losses. Accordingly, it is possible to achieve uniform illumination of a given field of view without additional beam-shaping optics. In particular, the intensity profile is realized with steep flanks.

Figure 8C:
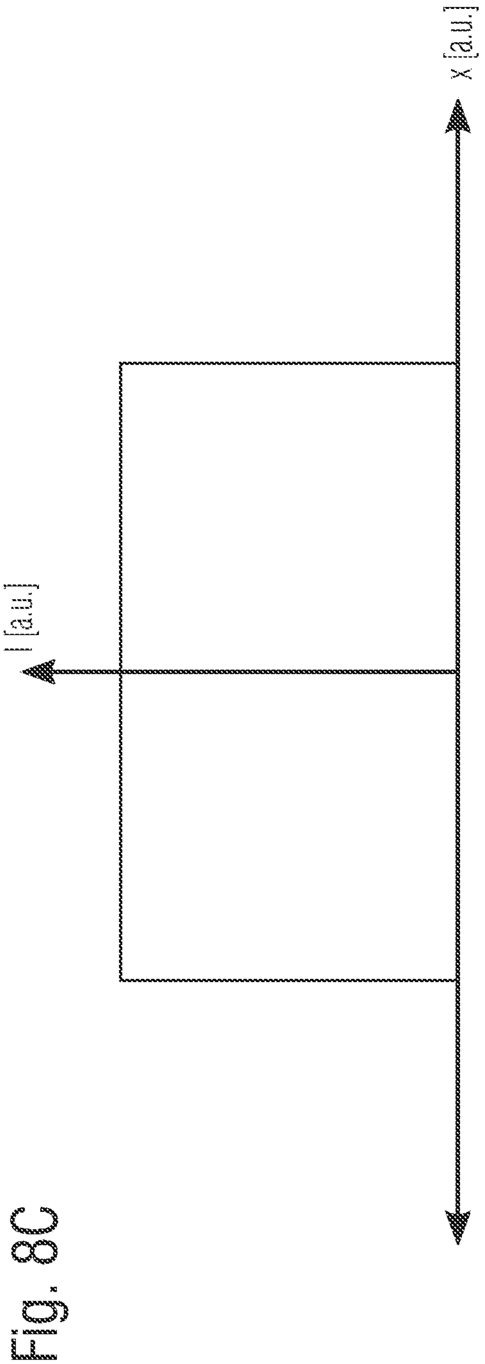
FIG. 8C shows an intensity distribution of a laser device according to embodiments.

This is illustrated, for example, in FIG. 8C, which shows the intensity as a function of the x coordinate. Compared to conventional intensity curves, the intensity in an edge region does not decrease gradually, but in a step-like manner. As a result, the maximum illumination intensity is obtained in an edge region. As a result, the light emitted from the surface of the semiconductor laser may be almost perfectly precollimated in a vertical direction.

Figure 8D:
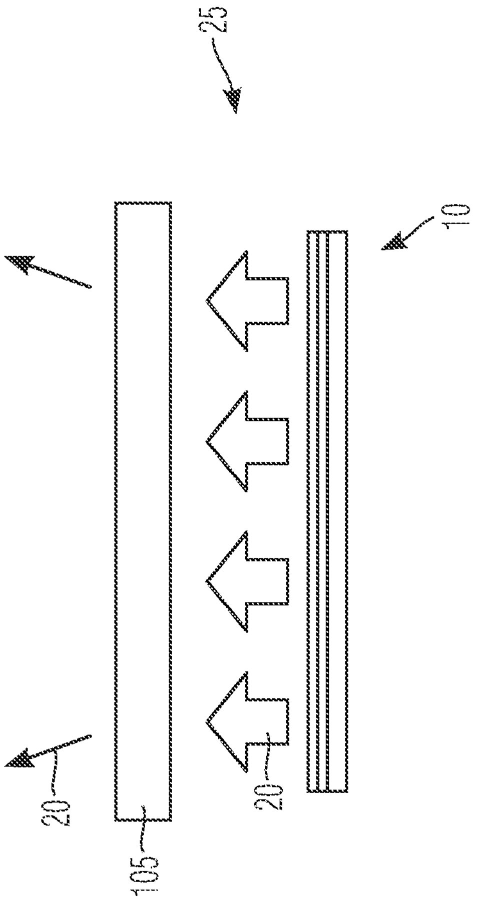
FIG. 8D illustrates a laser device according to embodiments.

According to embodiments, the semiconductor laser 10 may be combined with an optical element 105, resulting in a laser device 25. For example, the optical element may be mounted directly onto the chip or through an air gap or adhesive within a package together with the surface-emitting semiconductor laser. Examples of the optical element include, for example, diffractive or refractive optical elements, metal lenses, or any lens arrangements. Perfect precollimation of the emission from the surface-emitting semiconductor laser allows any intensity profile to be perfectly realized with conventional optical elements 105. This is illustrated in FIG. 8D.

As described above, a very flat and compact illumination device may thus be provided. An illumination device including the described surface-emitting semiconductor laser may be used, for example, as a general illumination device, for measurements, for example time of flight (ToF) measurements, or also face recognition methods.

In particular, if the surface-emitting semiconductor laser described herein is manufactured by the method explained in FIGS. 3A to 7, a respectively different ordered photonic structure may be easily manufactured for a plurality of pixels, namely by appropriately patterning the hardmask 117 as shown in FIG. 3C, for example.

The following describes embodiments in which arrays of highly miniaturized surface-emitting semiconductor laser elements are combined with an ordered photonic structure.

Figure 9A:
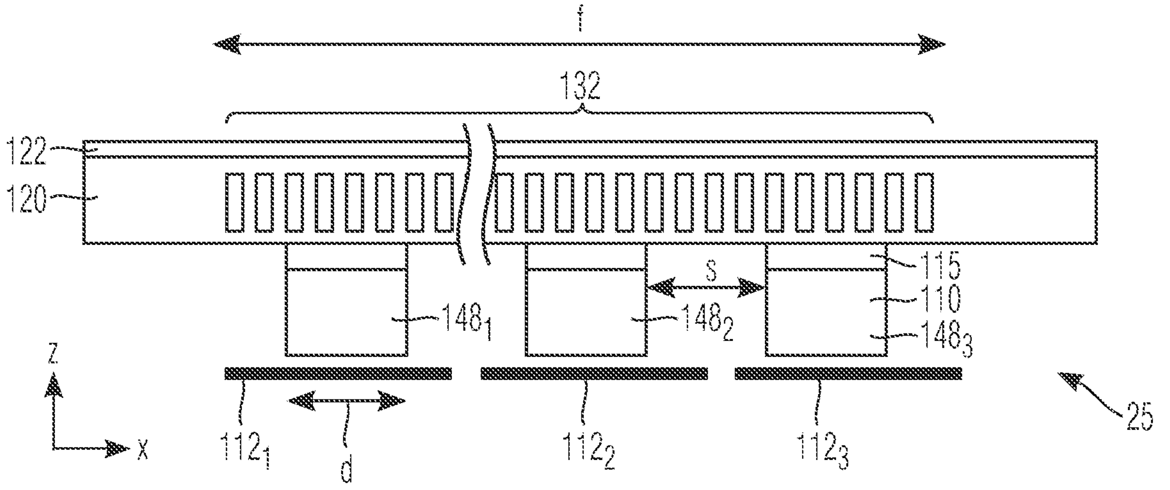
FIG. 9A shows a cross-sectional view of a laser device according to embodiments.

FIG. 9A shows a laser device 25 having an array of a plurality of surface-emitting semiconductor laser elements 148$_1$, 148$_2$, 148$_3$ according to embodiments. Each of the semiconductor laser elements 148$_1$, 148$_2$, 148$_3$ comprises a first semiconductor layer 110 of a first conductivity type, such as n-type, an active zone 115 adapted to generate electromagnetic radiation. The array further comprises an ordered photonic structure 132, and a second semiconductor layer 120 of a second conductivity type, and first and second contact elements 112, 122. The ordered photonic structure 132 and the second semiconductor layer are associated with at least two semiconductor laser elements 148$_1$, 148$_2$. The second contact element is electrically connected to the second semiconductor layer 120, and the active zone is disposed between the first semiconductor layer 110 and the second semiconductor layer 120. The ordered photonic structure 132 is disposed between the active zone 115 and the second contact element 122. For example, the second semiconductor layer 120 is directly adjacent to or arranged neighboring on the second contact element 122. The ordered photonic structure is formed as a continuous, i.e., uninterrupted, region extending over multiple pixels.

As has been described previously, the ordered photonic structure 132 requires a certain minimum size in the lateral direction, for example more than 1 μm, so that the photonic band structure may be formed. Conversely, however, it may be necessary to use particularly small laser elements 148$_1$ for certain applications, such as μ-displays. In this case, an ordered photonic structure 132 may be associated with multiple laser elements 148. For example, a horizontal dimension d of the semiconductor laser elements may be less than 10 μm. A horizontal dimension f of the ordered photonic structure is greater than 10 μm. For example, the horizontal dimension d of the semiconductor laser elements 148 may be less than 1 μm, for example 200 to 500 nm. For example, together with the ordered photonic structure 132, the second semiconductor layer 120 may be associated with a plurality of laser elements 148.

Furthermore, the second contact element 122 may be associated with multiple laser elements 148. However, according to further embodiments, it is also possible that a second contact element 122 is provided for each laser element 148. Each individual laser element 148 may be controlled via an associated first contact element 112$_1$, 112$_2$, 112$_3$. For example, each of the first contact elements 112 may be formed as a mirror and may include, for example, a metallic reflective material to increase laser efficiency. For example, each of the contact elements 112 may include a layer stack including metal and ITO (indium tin oxide). According to embodiments, the ordered photonic structure 132 may vary along a horizontal direction, such as the x or y direction. As a result, a broader wavelength distribution may be obtained from the active part of the pixel. More specifically, the half-width may be several nm, which may minimize interference effects.

For example, the distance s between adjacent laser elements 148 may be greater than 1 μm or even greater than 2 μm. According to further embodiments, neighboring laser elements 148 may also be directly adjacent to each other. For example, there may be a smooth transition of the radiation pattern in this case. The active part d of the laser element 148 may be smaller than 1 μm. The dimension f of the ordered photonic structure 132 may be greater than 10 μm, for example greater than 100 μm. Accordingly, the ordered photonic structure 132 extends over multiple pixels. The structure described allows for a small pixel pitch to be realized.

Furthermore, a desirable narrow radiation pattern may be set for the entire laser device by a suitable design of the ordered photonic structure 132.

Figure 9B:
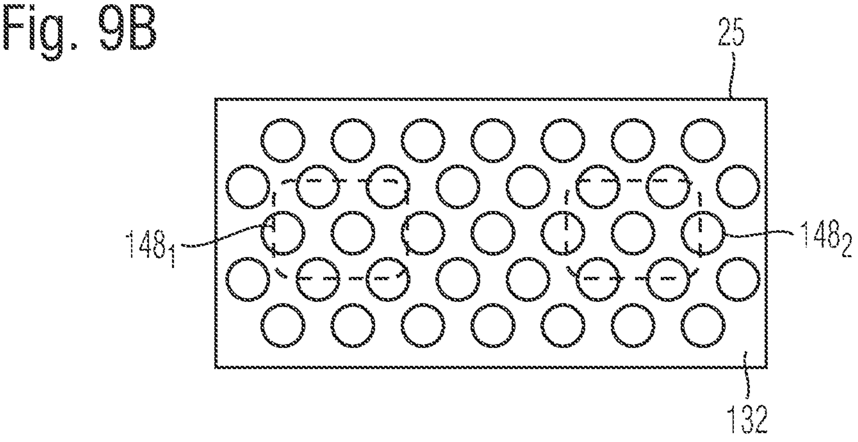
FIG. 9B shows a top view of a laser device according to embodiments.

FIG. 9B shows a top view of the laser device. The individual laser elements 148$_1$, 148$_2$ are indicated by dashed lines.

Figure 9C:
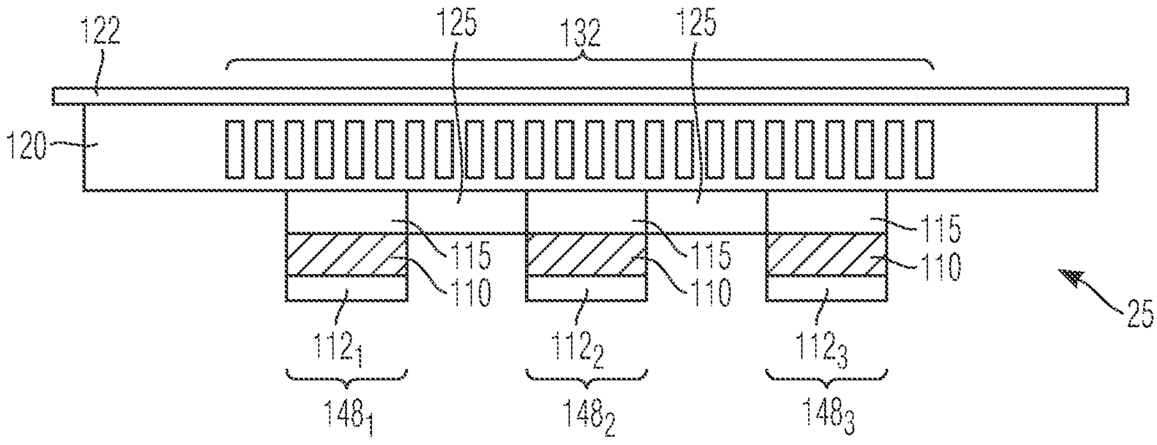
FIG. 9C shows a cross-sectional view of a laser device according to further embodiments.

FIG. 9C shows a schematic cross-sectional view of the laser device 25 according to further embodiments. Deviating from the structure shown in FIG. 9A, the laser device here additionally comprises a filling material 125 between the active zones 115 of the individual laser elements 148$_1$, 148$_2$, 148$_3$. Other components are realized analogous to those illustrated in FIG. 9A. The filling material 125 may have a refractive index similar to that of the active zone 115. For example, the filling material may be the same or a very similar material as that of the active zone 115. However, the active zone 115 is in each case isolated from the filling material 125 to suppress crosstalk with adjacent laser elements. The individual laser elements 148$_1$, 148$_2$, 148$_3$ may each be controlled individually via the second contact elements 112$_1$, 112$_2$, 112$_3$, thereby avoiding current leakage into the neighboring pixels. Due to the presence of the filling material, the functionality of the photonic crystal or ordered photonic structure 132 may be improved.

As has been described, a laser device comprising an array of a plurality of surface-emitting semiconductor laser elements is thus provided, in which a narrow radiation pattern and high system efficiency are achieved. The laser device may be used for a μ-display for AR ("augmented reality") applications, for example.

Figure 10A:
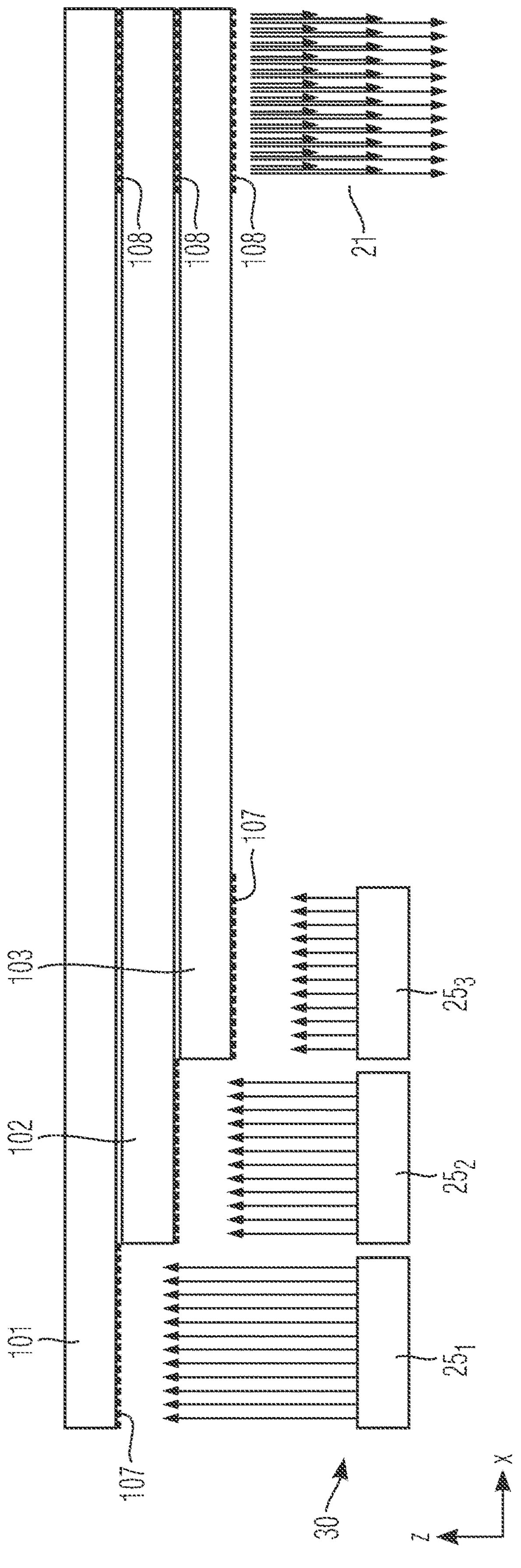
FIG. 10A shows a schematic view of an illumination device according to embodiments.

FIG. 10A shows an illumination device 30 according to embodiments. The illumination device 30 comprises a plurality of laser devices 25$_1$, 25$_2$, 25$_3$ each adapted to emit light of different wavelengths, for example red, green, blue. Each of the laser devices 25$_1$, 25$_2$, 25$_3$ may be constructed, for example, as shown in FIGS. 9A to 9C. The material system of each of the laser devices is chosen so as to emit electromagnetic radiation of a predetermined color. Each of the laser devices 25$_1$, 25$_2$, 25$_3$ has an associated waveguide. For example, the first waveguide 101 comprises an incoupling element and an outcoupling element 108. Similarly, the second and third waveguides each comprises an incoupling element 107 and an outcoupling element 108. The first, second, and third laser devices 25$_1$, 25$_2$, 25$_3$ are arranged adjacent to each other in the horizontal direction (x-direction). The first, second, and third waveguide elements 101, 102, 103 are arranged one above the other in the vertical direction (z-direction), for example. In this case, the second waveguide does not cover a region of the first waveguide 101 that overlaps with the first laser device 25$_1$. An incoupling structure 107, such as a suitable grating or another suitable incoupling structure, is provided at the exposed region of the first waveguide 101. In a corresponding manner, a region of the second waveguide 102 opposite the second laser device 25$_2$ is not covered. A suitable incoupling element 107 is provided in this region also. A region of the third waveguide 103 opposite the third laser device 25$_3$ also comprises an incoupling element 107.

In this manner, electromagnetic radiation that has been emitted, for example, by the first laser device 25$_1$ may be coupled into the first waveguide 101. At the other end of each of the waveguides, an outcoupling element 108 is present. Here, the outcoupling elements 108 of the first waveguide 101, the second waveguide 102, and the third waveguide 103 are each arranged one above the other so that the respective outcoupled light components are superimposed on each other. As a result, a combined beam 21 containing emitted radiation from the first laser device 25$_1$, the second laser device 25$_2$, and the third laser device 25$_3$ is output. In this manner, an RGB image may be generated by modulating the individual laser devices. Due to the high intensity, the corresponding laser devices may also be combined with lossy optical systems.

The array shown, for example, in FIG. 10A allows for very high intensity of the emitted electromagnetic radiation 20 to be achieved. Due to the special structure of the individual laser devices 25$_1$, 25$_2$, each comprising an ordered photonic structure 132, it is possible to switch the laser devices very quickly, since spontaneous emission is suppressed here due to the different wavelength selection mechanism. The array may be used in a display device, for example a μ-display, especially for AR applications.

Figure 10B:
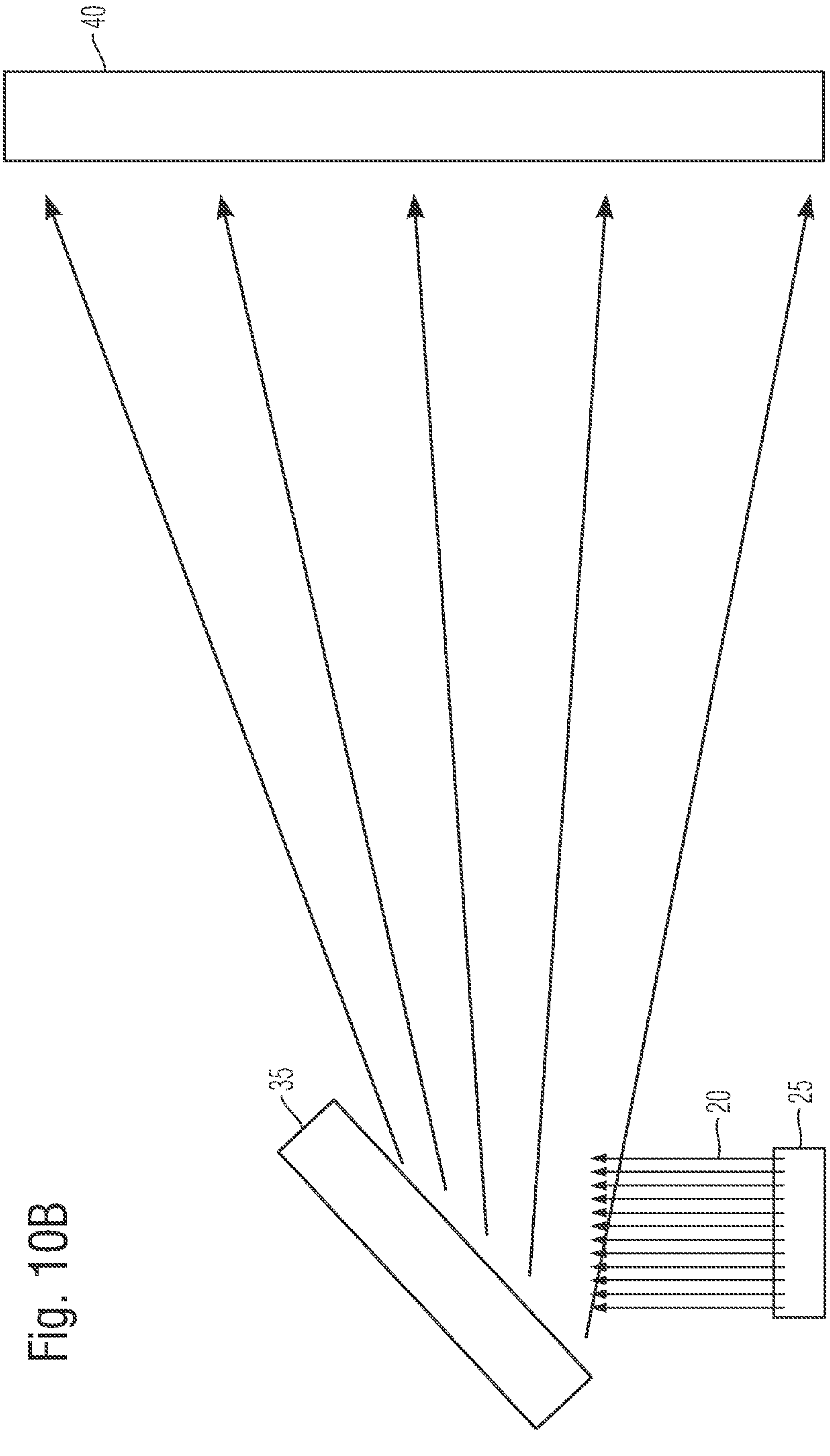
FIG. 10B illustrates an application of an illumination device according to embodiments.

FIG. 10B shows a system comprising a laser device 25, for example as shown in one of FIGS. 9A to 9C, and a microelectromechanical system 35, for example for deflecting the generated electromagnetic radiation 20. Using the microelectromechanical system 35, the field of view of the laser device 25 may be enlarged. Due to the high intensity of the radiation 20 emitted from the laser device 25, the intensity is still sufficient even with the field of view being enlarged. Due to the high quality of the emitted radiation 20, a very high resolution may be achieved by this approach.

A system comprising the laser device shown in FIGS. 9A to 9C, 10A, 10B may be a display device, for example.

According to further embodiments, the ordered photonic structure 132 may in each case be formed in an n-type semiconductor layer 114. In this manner, an increased carrier mobility may be achieved in the ordered photonic structure 132. As a result, the forward voltage is reduced and the current distribution may be made more homogeneous.

Figure 11A:
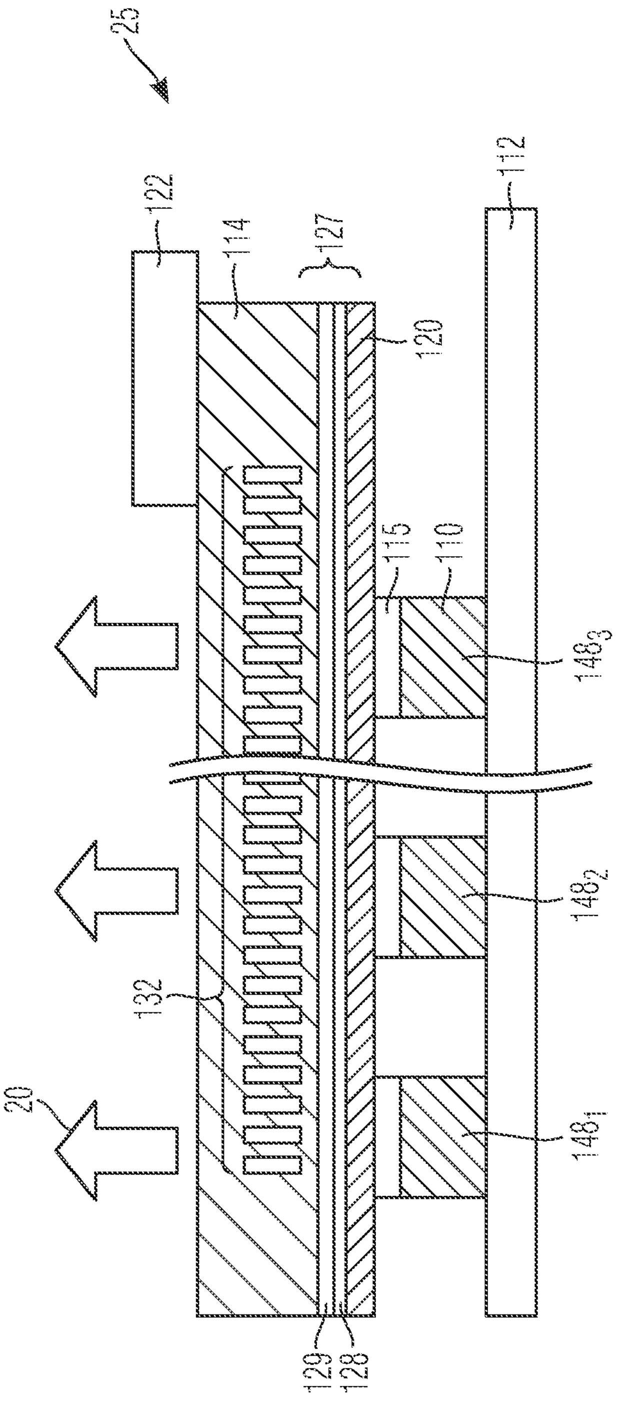
FIG. 11A shows a cross-sectional view of a laser device according to embodiments.

FIG. 11A shows a cross-sectional view through a laser device 25 according to embodiments. The laser device 25 comprises an array of a plurality of semiconductor laser elements 148$_1$, 148$_2$, . . . 148$_m$ each having a first semiconductor layer of a first conductivity type 110 and an active zone 115. A first contact element 112 is respectively arranged with the first semiconductor layer 110 of the semiconductor laser elements 148$_1$, 148$_2$, 148$_3$. In contrast to what is shown, for example, in FIG. 9A, the second semiconductor layer 120 is in this case adjacent to the active zone 115. The ordered photonic structure 132 is formed in a third semiconductor layer 114 of the first conductivity type. A part of the third semiconductor layer is disposed over the ordered photonic structure. Another part of the third semiconductor layer 114 is disposed beneath the ordered photonic structure. In other words, according to embodiments, the third semiconductor layer is adjacent to two horizontal main surfaces of the ordered photonic structure. For example, the third semiconductor layer 114 is directly adjacent to or disposed adjacent to the second contact element 122. The second semiconductor layer 120 is connected to the third semiconductor layer 114 via a tunnel contact 127. The tunnel contact 127 comprises a highly doped layer 128 of the second conductivity type, for example $p^{++}$-type, and a highly doped layer 129 of the first conductivity type, for example $n^{++}$-type.

The $p^{++}$-doped layer 128 and the $n^{++}$-doped layer 129, and optionally an intermediate layer (not shown) form a tunnel diode or tunnel junction 127. The $n^{++}$-doped layer 129 of the tunnel junction 127 is electrically connected to the positive electrode or the second contact element 122 through the layer 114 of the first conductivity type. Voids are injected into the region of the active zone 115 through the tunnel junction 127, the n side of which is connected to the positive electrode or the second contact element 122. There, the injected voids recombine with electrons provided by the negative electrode or the first contact element 112, thereby emitting photons.

As shown in FIG. 11A, the tunnel junction 127 is associated with a plurality of semiconductor laser elements 148$_1$, 148$_2$, 148$_3$, as are the ordered photonic structure 132, the third semiconductor layer 114, and the second semiconductor layer 120.

According to further embodiments, the tunnel junction 127 may also extend partially into the ordered photonic structure 132. For example, the tunnel junction 127 may be located within the ordered photonic structure 132. For example, layers of the ordered photonic structure 132 may form a tunnel junction. According to further embodiments, the tunnel junction may be located above the ordered photonic structure 132. According to further embodiments, the tunnel junction may also be located between the active zone 115 and the ordered photonic structure 132.

Figure 11B:
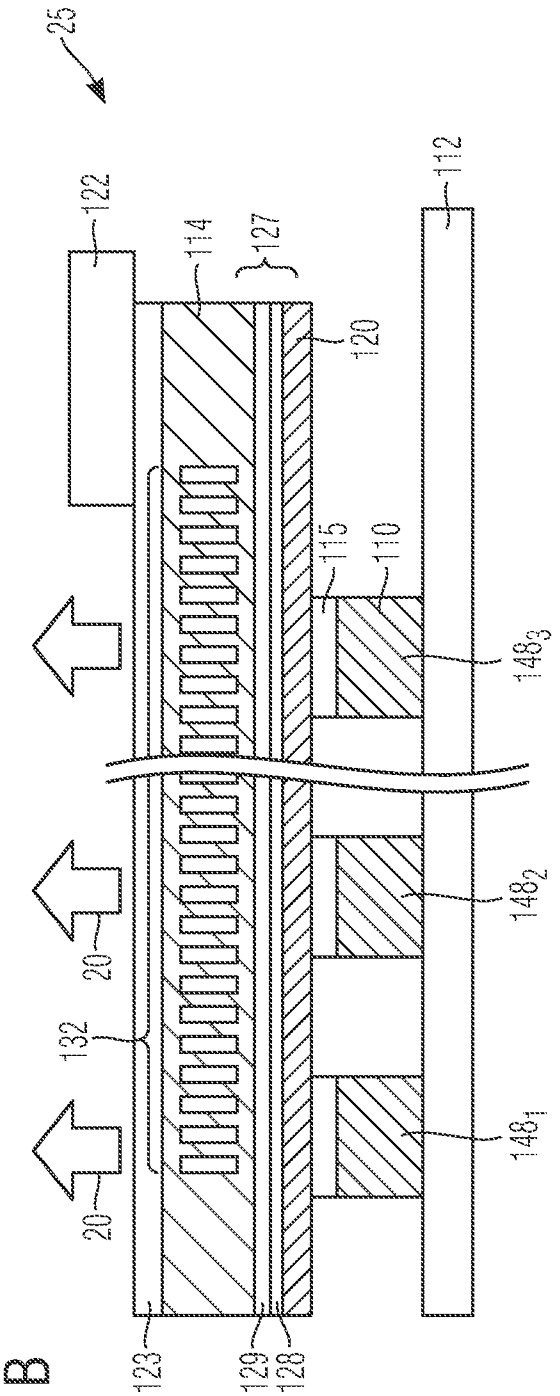
FIG. 11B shows a schematic cross-sectional view of a laser device according to further embodiments.

FIG. 11B shows a schematic cross-sectional view of a laser device 25 according to further embodiments. In addition to the components shown in FIG. 11A, the laser device 25 further comprises an antireflection layer 123, for example an ITO layer or any other suitable layer, by which reflection of the generated electromagnetic radiation 20 at the interface between the third semiconductor layer 114 and air is reduced. As a result, the intensity of the emitted radiation is increased. For example, according to embodiments, the second contact element 122 is in this case directly adjacent to the antireflection layer 123. The antireflection layer 123 is directly adjacent to the third semiconductor layer 114.

Figure 11C:
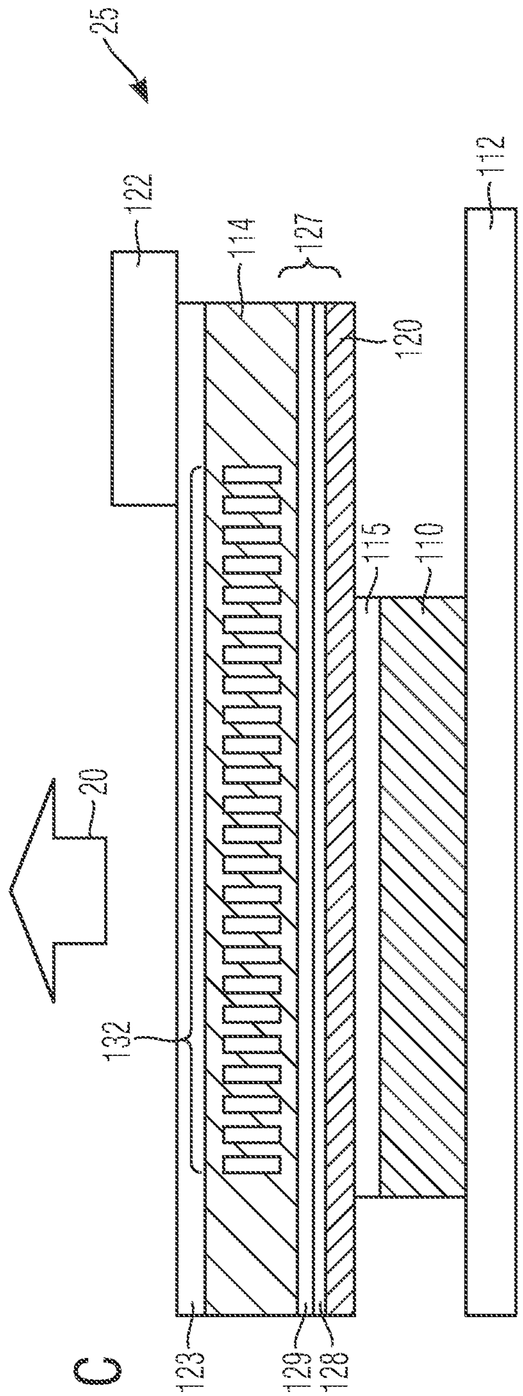
FIG. 11C shows a schematic cross-sectional view of a laser device according to further embodiments.

FIG. 11C shows a schematic cross-sectional view of a laser device 25 according to further embodiments. Unlike the laser device 25 shown in FIGS. 11A and 11B, the laser device 25 in this case does not comprise a plurality of individual laser elements 148$_1$, 148$_2$, 148$_3$ associated with a common ordered photonic structure 132. Rather, here a single semiconductor laser element is associated with the photonic structure 132. For example, the semiconductor laser element may have a dimension in the range of 1 μm or larger. The ordered photonic structure 132 may have a lateral dimension greater than that of the semiconductor laser element.

Figure 11D:
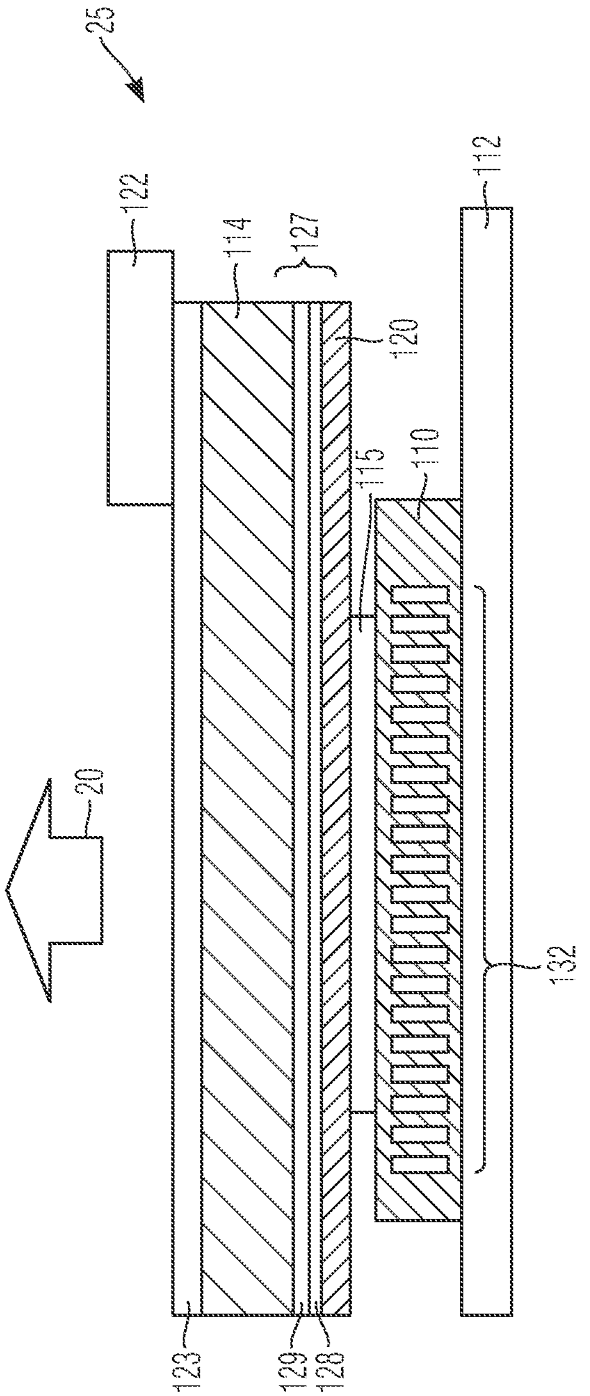
FIG. 11D shows a schematic cross-sectional view of a laser device according to further embodiments.

FIG. 11D shows a cross-sectional view of a laser device 25 according to further embodiments. Unlike the semiconductor devices illustrated in FIGS. 11A to 11C, the ordered photonic structure 132 is in this case formed in the first semiconductor layer 110 of the first conductivity type. The first contact element 112 is disposed adjacent to the first semiconductor layer 110. The active zone 115 is formed adjacent to the first semiconductor layer 110. Furthermore, the second semiconductor layer 120 is formed adjacent to the active zone 115. A tunnel junction 127 is adapted to connect the second semiconductor layer 120 to the third semiconductor layer 114 of the first conductivity type. Furthermore, an antireflection layer 123 may be provided on the top surface of the third semiconductor layer 114. In the embodiment shown in FIG. 11D, the ordered photonic structure 132 is again formed in a semiconductor layer of the first conductivity type, for example, n-type.

As shown in FIGS. 11C and 11D, a surface-emitting semiconductor laser comprises a first n-doped semiconductor layer 110, an ordered photonic structure 132, and an active zone 115 adapted to generate electromagnetic radiation. The surface-emitting semiconductor laser further comprises a second p-doped semiconductor layer 120, and a third n-doped semiconductor layer 114. The surface-emitting semiconductor laser further includes a tunnel junction 127 adapted to electrically connect the second p-doped semiconductor layer 120 to the third n-doped semiconductor layer 114. The active zone 115 is disposed between the second p-doped semiconductor layer 120 and the first n-doped semiconductor layer 110. The ordered photonic structure 132 is formed in the first or the third n-doped semiconductor layer 110, 114.

The embodiments described herein may be further modified and, in particular, modified with respect to the features described in FIGS. 1 to 10. For example, the ordered photonic structure as detailed in FIGS. 8A to 8C may be combined with a tunnel junction 127. More specifically, in the structure illustrated in FIG. 8B, the ordered photonic structure 145$_1$, 145$_2$, 145$_3$ may in each case be formed in a semiconductor layer of the first conductivity type. Electrical contact to a second contact element 122 may be made via a tunnel contact 127.

Although specific embodiments have been illustrated and described herein, those skilled in the art will recognize that the specific embodiments shown and described may be replaced by a multiplicity of alternative and/or equivalent configurations without departing from the scope of the invention. The application is intended to cover any adaptations or variations of the specific embodiments discussed herein. Therefore, the invention is to be limited by the claims and their equivalents only.

The invention claimed is:

1. A laser device comprising an array of a plurality of surface-emitting semiconductor laser elements, each of the semiconductor laser elements comprising:
- a first semiconductor layer of a first conductivity type; and
- an active zone configured to generate electromagnetic radiation;

the array further comprising
- an ordered photonic structure;
- a second semiconductor layer of a second conductivity type,
- a first and a second contact element,
- wherein the ordered photonic structure and the second semiconductor layer are associated with at least two semiconductor laser elements,
- wherein a horizontal dimension of each of the semiconductor laser elements is less than 10 μm, and a horizontal dimension of the ordered photonic structure is greater than 10 μm,
- the second contact element is electrically connected to the second semiconductor layer,
- wherein the active zone is disposed between the first semiconductor layer and the second semiconductor layer,
- the ordered photonic structure is disposed between the active zone and the second contact element.

2. The laser device according to claim 1, wherein the active zones of the individual semiconductor laser elements are electrically isolated from each other, and a filling material is disposed in a gap between adjacent semiconductor laser elements.

3. The laser device according to claim 1, wherein the second semiconductor layer is adjacent to the second contact element, and the ordered photonic structure is disposed in the second semiconductor layer.

4. The laser device according to claim 1, further comprising a third semiconductor layer of the first conductivity type adjacent to the second contact element, and a tunnel junction configured to electrically connect the second semiconductor layer to the third semiconductor layer, wherein the ordered photonic structure is disposed in the third semiconductor layer.

* * * * *